United States Patent
Leng

(10) Patent No.: US 12,272,639 B2
(45) Date of Patent: Apr. 8, 2025

(54) INTEGRATED INDUCTOR WITH INDUCTOR WIRE FORMED IN AN INTEGRATED CIRCUIT LAYER STACK

(71) Applicant: Microchip Technology Incorporated, Chandler, AZ (US)

(72) Inventor: Yaojian Leng, Vancouver, WA (US)

(73) Assignee: Microchip Technology Incorporated, Chandler, AZ (US)

( * ) Notice: Subject to any disclaimer, the term of this patent is extended or adjusted under 35 U.S.C. 154(b) by 401 days.

(21) Appl. No.: 17/719,548

(22) Filed: Apr. 13, 2022

(65) Prior Publication Data

US 2023/0129684 A1    Apr. 27, 2023

Related U.S. Application Data

(60) Provisional application No. 63/272,513, filed on Oct. 27, 2021.

(51) Int. Cl.
*H01L 23/52* (2006.01)
*H01F 17/00* (2006.01)
(Continued)

(52) U.S. Cl.
CPC ..... *H01L 23/5227* (2013.01); *H01F 17/0013* (2013.01); *H01F 27/2823* (2013.01);
(Continued)

(58) Field of Classification Search
CPC .... H10D 1/20; H10D 30/674; H01F 17/0013; H01F 27/2823; H01F 2017/002;
(Continued)

(56) References Cited

U.S. PATENT DOCUMENTS

| 11,094,628 B2 | 8/2021 | Leng | |
|---|---|---|---|
| 2005/0003562 A1* | 1/2005 | Bhatt | H01L 28/10 |
| | | | 257/E21.022 |

(Continued)

FOREIGN PATENT DOCUMENTS

| CN | 102800647 A | 11/2012 | |
|---|---|---|---|
| CN | 106298736 B | * 11/2018 | ......... H01L 23/5227 |

(Continued)

OTHER PUBLICATIONS

International Search Report and Written Opinion, Application No. PCT/US2022/026480, 17 pages, Aug. 26, 2022.

*Primary Examiner* — S M Sohel Imtiaz
(74) *Attorney, Agent, or Firm* — SLAYDEN GRUBERT BEARD PLLC

(57) ABSTRACT

A device includes (a) an integrated inductor having an inductor wire and (b) a metal interconnect arrangement, both formed in an integrated circuit layer stack of alternating metal layers and via layers. At least a portion of the inductor wire is defined by an inductor element stack including multiple metal layer inductor elements formed in multiple respective metal layers, and multiple via layer inductor elements formed in multiple respective via layers and conductively connected to the metal layer inductor elements. Each via layer inductor element has a length of at least 1 μm in each of two lateral directions orthogonal to each other and perpendicular to the vertical direction. The metal interconnect arrangement includes metal layer interconnect elements formed in the respective metal layers, and interconnect vias formed in the respective via layers.

20 Claims, 31 Drawing Sheets

(51) Int. Cl.
    *H01F 27/28*     (2006.01)
    *H01L 23/522*     (2006.01)
    *H01L 23/528*     (2006.01)
    *H01L 23/532*     (2006.01)
    *H10D 1/20*     (2025.01)

(52) U.S. Cl.
    CPC ........ *H01L 23/5226* (2013.01); *H01L 23/528* (2013.01); *H01L 23/53223* (2013.01); *H01L 23/53238* (2013.01); *H10D 1/20* (2025.01); *H01F 2017/002* (2013.01); *H01F 2017/0073* (2013.01); *H01F 2017/0086* (2013.01)

(58) Field of Classification Search
    CPC ............... H01F 41/043; H01L 23/5227; H01L 23/5226; H01L 23/528; H01L 23/53223; H01L 28/10
    See application file for complete search history.

(56) References Cited

U.S. PATENT DOCUMENTS

| | | | |
|---|---|---|---|
| 2005/0104157 A1* | 5/2005 | Coolbaugh | H01L 23/5228 257/E23.152 |
| 2020/0144358 A1* | 5/2020 | Koduri | H01L 28/10 |
| 2020/0402698 A1* | 12/2020 | Tiemeijer | H03F 3/21 |
| 2021/0066191 A1* | 3/2021 | Chen | H01L 23/645 |
| 2021/0384122 A1 | 12/2021 | Leng et al. | |

FOREIGN PATENT DOCUMENTS

| | | |
|---|---|---|
| CN | 109755224 B | 8/2020 |
| EP | 1398801 A2 | 3/2004 |
| EP | 3961926 A1 | 3/2022 |
| JP | 2012222252 A | 11/2012 |
| JP | 2013131597 A | 7/2013 |
| KR | 20050113923 A | 12/2005 |
| WO | 02/05298 A2 | 1/2002 |

* cited by examiner

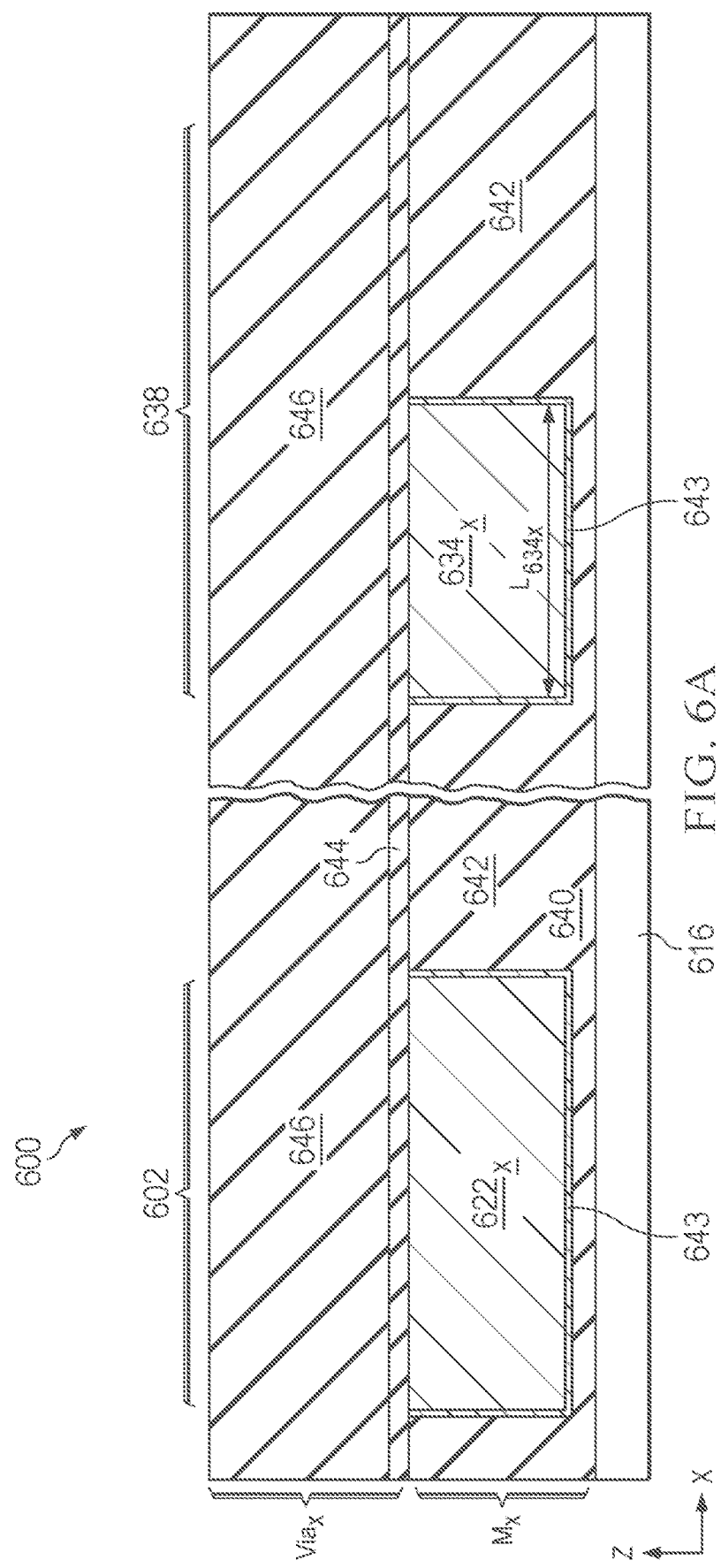

INTEGRATED INDUCTOR WITH INDUCTOR WIRE FORMED IN AN INTEGRATED CIRCUIT LAYER STACK

RELATED PATENT APPLICATION

This application claims priority to commonly owned U.S. Provisional Patent Application No. 63/272,513 filed Oct. 27, 2021, the entire contents of which are hereby incorporated by reference for all purposes.

TECHNICAL FIELD

The present disclosure relates to integrated circuit (IC) devices, and more particularly to an integrated inductor with an inductor wire formed in an integrated circuit layer stack.

BACKGROUND

As integrated circuits have become increasingly more complex and expensive, the semiconductor industry has adopted new technologies to manage the increased complexity inherent in large chips. One such technology is the "system on a chip" (SoC) concept, wherein a complete system is fabricated monolithically on a single silicon chip, in contrast with fabricating and mounting multiple devices on a common printed circuit board (PCB). SoCs allow users to build smaller and simpler systems based on a single chip, often resulting in a significant reduction of power usage, cost, and form factor, and improved device reliability and battery life.

An SoC may include one or more types of electronic devices, for example transistors, capacitors, resistors, and/or inductors. An inductor formed in an SoC is referred to herein as an "integrated circuit inductor" or simply "integrated inductor." Integrated inductors have a wide range of applications. For example, integrated inductors are useful in radio frequency (RF) and millimeter-wave circuits (e.g., used in mobile devices) in which high-frequency operation requires small inductance, as compared with PCB-mounted inductors which are often overwhelmed by parasitic effects. Integrated inductors are also particularly suitable for low-noise amplifiers (LNAs), resonant load and matching network applications, and RF filters. As another example, integrated inductors are very useful for constructing a power supply on a chip (PowerSoC), for example in a power management device (e.g., DC-DC converter). Such integrated inductors may be used in integrated voltage regulators (IVRs) and switch mode power supplies (SMPSs), such as buck-boost converters, for example.

However, although integrated inductors are useful in many different applications, they are typically difficult to manufacture, e.g., as compared with resistors and capacitors constructed in SoCs.

Conventional integrated inductors are typically constructed with thick wires (typically formed from aluminum or copper) using customized processes, i.e., with a dedicated extra thick metal layer, and are thus relatively expensive. The thick wire inductor provides certain performance benefits. In particular, increased wire thickness reduces resistance, which improves the quality factor (Q) of a typical integrated inductor. The quality factor Q of an inductor may be represented by Equation 1:

$$Q = \omega * L/R \quad (1)$$

where $\omega$ represents angular frequency, L represents inductance, and R represents series resistance. According to Equation 1, reducing the resistance increases the inductor quality factor Q. There is a need for high-performance integrated inductors having low wire resistance and at low cost, e.g., by constructing such integrated inductors concurrently with other interconnect structures.

SUMMARY

The present disclosure provides integrated inductors having a low-resistance inductor wire formed in an integrated circuit layer stack including alternating metal layers and via layers. At least a portion of the inductor wire may be defined by a stack of conductively-connected inductor elements including metal layer inductor element(s) formed in respective metal layer(s), and via layer inductor element(s) formed in respective via layer(s). Each inductor element, including each metal layer inductor element and each via layer inductor element, may have a length of at least 1 µm, at least 2 µm, at least 5 µm, at least 10 µm, or at least 100 µm, in at least one lateral direction.

The integrated inductor may be formed concurrently with a multi-layer interconnect structure, e.g., where the integrated inductor and interconnect structure are formed in common metal layer(s) and via layer(s) in the integrated circuit layer stack.

In some examples, the integrated inductor may be formed without adding photolithographic mask steps to the background IC fabrication process. For example, an integrated inductor may be built concurrently with copper interconnect structures without any additional mask steps to the background IC fabrication process.

One aspect provides an integrated circuit (IC) device including an IC layer stack including multiple metal layers and multiple via layers formed in an alternating manner in a vertical direction, with respective ones of the via layers located between a respective pair of the metal layers. The IC device includes an integrated inductor comprising an inductor wire. At least a portion of the inductor wire is defined by an inductor element stack including (a) multiple metal layer inductor elements formed in multiple respective metal layers in the IC layer stack and (b) multiple via layer inductor elements formed in multiple respective via layers in the IC layer stack, wherein the multiple metal layer inductor elements and the multiple via layer inductor elements are conductively connected to each other, and wherein each via layer inductor element has a length of at least 1 µm in each of two lateral directions orthogonal to each other and perpendicular to the vertical direction. The IC device also includes a metal interconnect arrangement including (a) respective metal layer interconnect elements formed in the multiple respective metal layers and (b) respective interconnect vias formed in the multiple respective via layers.

In some examples, at least some of the multiple metal layers comprise metal interconnect layers.

In some examples, the interconnect via has a length less than 1 µm in at least one of the two lateral directions.

In some examples, each via layer inductor element has a length greater than 2 µm in each of the two lateral directions, and the interconnect via has length less than 0.5 µm in at least one of the two lateral directions.

In some examples, each via layer inductor element is formed in a respective tub opening in the respective via layer, the respective tub opening having a length of at least 1 µm in each of the two lateral directions.

In some examples, the metal layer interconnect element, the interconnect via, the respective metal layer inductor elements, and the respective via layer inductor elements are formed from copper.

In some examples, a top metal layer of the multiple metal layers include comprises an aluminum bond pad layer.

In some examples, the inductor wire has a sheet resistance of less than 10 mΩ/sq.

In some examples, the inductor wire has a sheet resistance of less than 3 mΩ/sq.

In some examples, the multiple metal layer inductor elements are laterally aligned with the multiple via layer inductor element.

In some examples, at least one of the multiple metal layer inductor elements is laterally offset from at least one of the multiple via layer inductor elements.

In some examples, the inductor element stack including the multiple metal layer inductor elements and the multiple via layer inductor elements defines a diagonally-extending wire segment of the inductor wire, the diagonally-extending wire segment extending diagonally with respect to the vertical direction.

In some examples, the integrated inductor comprises a spiral inductor, wherein the inductor wire has a spiral shape.

In some examples, the IC layer stack is formed over a silicon substrate, and a magnetic B-field of the integrated inductor extends parallel to the silicon substrate.

In some examples, the IC layer stack is formed over a silicon substrate, and a magnetic B-field of the integrated inductor extends perpendicular to the silicon substrate.

Another aspect provides and IC device comprising an IC layer stack formed over a silicon substrate, the IC layer stack including multiple metal layers and multiple via layers formed in an alternating manner in a vertical direction, with respective via layers located between a respective pair of the metal layers. The IC device includes an integrated inductor comprising a spiral inductor wire having a spiral shape and defining a magnetic B-field extending parallel to the silicon substrate. At least a portion of the spiral inductor wire is defined by an inductor element stack including (a) a metal layer inductor element formed in a respective metal layer in the IC layer stack, and (b) a via layer inductor element formed in a respective via layer in the IC layer stack vertically adjacent the respective metal layer, the via layer inductor element conductively connected to the metal layer inductor element, wherein the via layer inductor element has a lateral dimension of at least 1 μm in each of two lateral directions orthogonal to each other and perpendicular to the vertical direction.

In some examples, the IC device comprises a metal interconnect arrangement formed in the IC layer stack, the metal interconnect arrangement including (a) a metal layer interconnect element formed in the respective metal layer, and (b) an interconnect via formed in the respective via layer and conductively coupled to the metal layer interconnect element.

In some examples, the metal layer inductor element is laterally offset from the via layer inductor element.

In some examples, the inductor element stack including the metal layer inductor element and the via layer inductor element extends diagonally with respect to the vertical direction.

Another aspect provides an IC device comprising an IC layer stack formed over a silicon substrate, the IC layer stack including multiple metal layers and multiple via layers formed in an alternating manner in a vertical direction, with respective via layers located between a respective pair of the metal layers. The IC device includes an integrated inductor including (a) a laterally-extending lower wire segment formed in the IC layer stack, (b) a laterally-extending upper wire segment formed in the IC layer stack, and (c) a vertically-extending wire segment formed in the IC layer stack and conductively connecting the laterally-extending lower wire segment with the laterally-extending upper wire section. The vertically-extending wire segment comprises an inductor element stack including (a) a metal layer inductor element formed in a respective metal layer in the IC layer stack and (b) a via layer inductor element formed in a respective via layer adjacent the respective metal layer and conductively connected to the metal layer inductor element, wherein the via layer inductor element has a length of at least 1 μm in each of two lateral directions orthogonal to each other and perpendicular to the vertical direction. The inductor wire defines a magnetic B-field extending parallel to the silicon substrate.

BRIEF DESCRIPTION OF THE DRAWINGS

Example aspects of the present disclosure are described below in conjunction with the figures, in which:

FIGS. 6A-6D show an example process for constructing a vertically- and laterally-extending inductor element stack concurrently with a typical interconnect structure, using a damascene process;

Figure 1A:
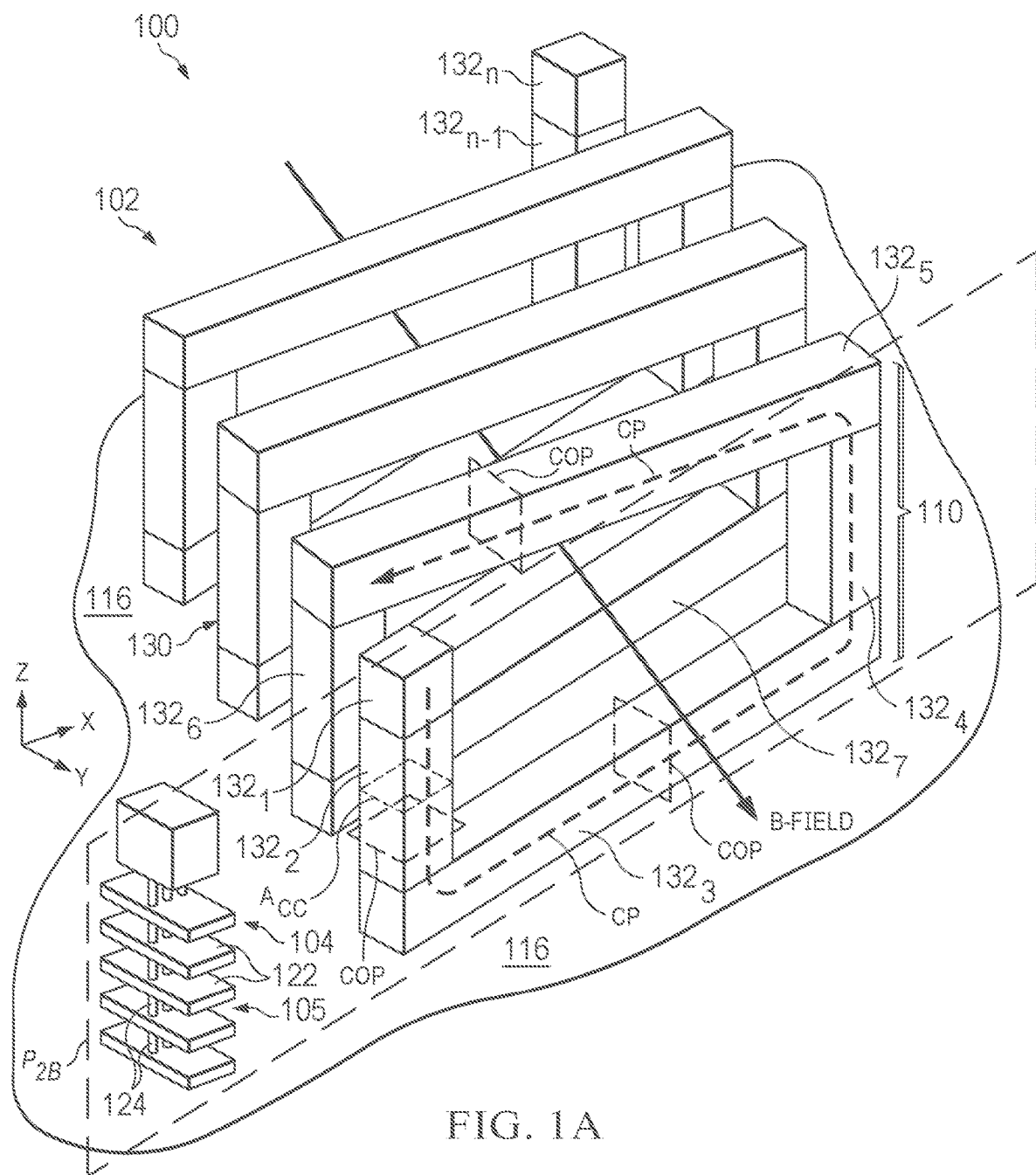
FIGS. 1A and 1B show an IC device including an example integrated inductor and an example metal interconnect arrangement.

It should be understood the reference number for any illustrated element that appears in multiple different figures has the same meaning across the multiple figures, and the mention or discussion herein of any illustrated element in the context of any particular figure also applies to each other figure, if any, in which that same illustrated element is shown.

DETAILED DESCRIPTION

The present disclosure provides integrated inductors having an inductor wire formed in an integrated circuit layer stack including alternating metal layers and via layers, the inductor wire being of low-resistance. At least a portion of the inductor wire is defined by an inductor element stack including multiple metal layer inductor elements formed in multiple respective metal layers, and multiple via layer inductor elements formed in multiple respective via layers and conductively connected to the metal layer inductor elements. Each inductor element stack (including each metal layer inductor element and each via layer inductor element) may have a length of at least 1 μm, 2 μm, 5 μm, 10 μm, or 100 μm in at least one lateral direction (e.g., a length of at least 1 μm, 2 μm, 5 μm, 10 μm, or 100 μm in the x-direction and/or the y-direction), depending on the particular implementation. As used herein, a "length" refers to a linear distance in a respective direction, e.g., in an x-direction (parallel with an x-axis), a y-direction (parallel with a y-axis), a z-direction (parallel with a z-axis), or other defined direction.

In some examples, the integrated inductor may be formed concurrently with a metal interconnect arrangement including at least one metal layer interconnect element formed in the at least one metal layer, and interconnect vias formed in the at least one via layer.

In some examples, the inductor wire of the integrated inductor may define a magnetic B-field extending parallel to an underlying silicon substrate. In other examples, the inductor wire of the integrated inductor may define a magnetic B-field extending perpendicular to an underlying silicon substrate.

In some examples, the inductor wire may include (a) a laterally-extending lower wire segment formed in the IC layer stack, (b) a laterally-extending upper wire segment formed in the IC layer stack, and (c) a vertically-extending wire segment formed in the IC layer stack conductively connecting the laterally-extending lower wire segment with the laterally-extending upper wire section. The vertically-extending wire segment comprises an inductor element stack including (a) at least one metal layer inductor element formed in at least one respective metal layer in the IC layer stack and (b) at least one via layer inductor element formed in at least one respective via layer adjacent the respective metal layer, each via layer inductor element having a length of at least 1 μm in each of two lateral directions orthogonal to each other and perpendicular to a vertical direction. In some examples such inductor wire may have a spiral shape defining a magnetic B-field extending parallel to an underlying substrate, e.g., silicon substrate.

Figure 1B:
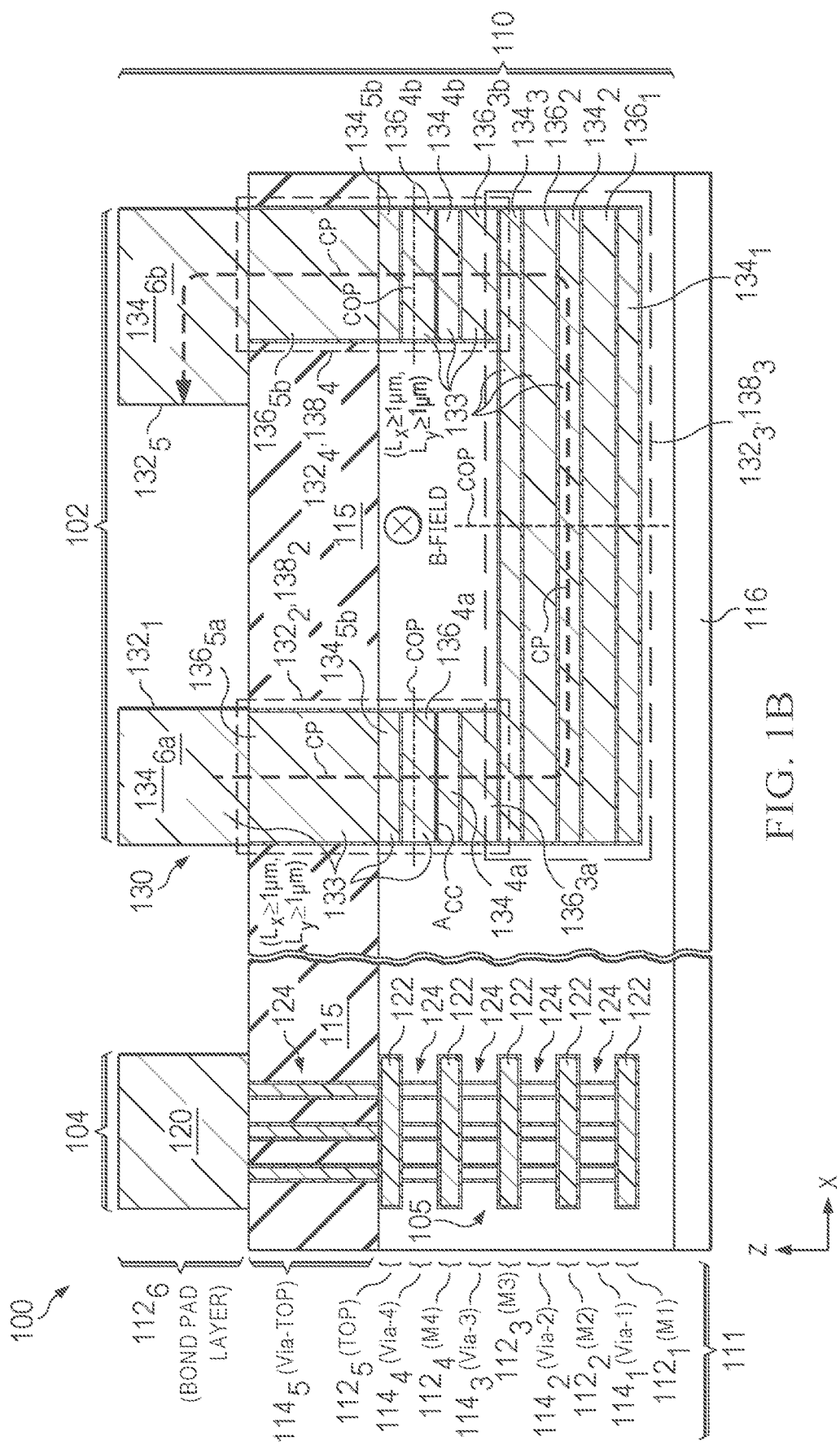

FIGS. 1A and 1B show an IC device 100 including an example integrated inductor 102 and an example metal interconnect arrangement 104. FIG. 1A shows a three-dimensional view of IC device 100 from above, and FIG. 1B shows a side cross-sectional view of IC device 100 through plane $P_{2B}$ shown in FIG. 1A.

As shown in FIGS. 1A and 1B collectively, IC device 100 includes an IC layer stack 110 formed over a substrate 116, e.g., a silicon substrate, extending in an x-y plane (e.g., perpendicular to the z-direction). The IC layer stack 110 may be formed directly on the substrate 116, or IC device 100 may include any number of intervening layers or structures (not shown) between the substrate 116 and the bottom of the IC layer stack 110.

The IC layer stack 110 includes a stack of IC layers 111 including multiple metal layers $112_1$-$112_6$ and multiple via layers $114_1$-$114_5$ formed in an alternating manner in a vertical direction (z-direction), with respective via layers 114 located between a respective pair of metal layers 112. Metal layers $112_1$-$112_6$ and via layers $114_1$-$114_5$ are also referred to simply as metal layers 112 and via layers 114, respectively, for convenience.

With reference to FIG. 1B, metal layers $112_1$-$112_5$ are metal interconnect layers (referred to as M1, M2, M3, M4, and MTOP, respectively) and metal layer $112_6$ is a bond pad layer, and via layers $114_1$-$114_5$ are interconnect via layers (referred to as Via-1, Via-2, Via-3, Via-4, and Via-top, respectively). Via layer $114_5$ (Via-top) may be formed in a passivation layer 115, and may be deeper (z-direction) than respective via layers $114_1$-$114_4$. In one example, each metal interconnect layer $112_1$-$112_5$ and each via layer $114_1$-$114_5$ may have a z-direction depth of about 0.4 μm, via layer $114_5$ (Via-top) may have a z-direction depth of about 2 μm, and bond pad layer metal layer $112_6$ may have a z-direction depth of about 2 μm. However, any of the IC layers 111 discussed above may have any other suitable z-direction depth. The term via layer, as used herein and throughout, refers to the metal elements formed in the passivation layer.

Passivation layer 115 may include any suitable passivation material(s). In one example, passivation layer 115 comprises a four layer construction including (1) 0.1 μm Silicon Nitride, (2) 0.1 μm Silicon Rich Oxide (SRO), (3) 0.68 μm Phosphorus Silicate Glass (PSG), and (4) 0.59 μm Silicon Oxy-Nitride (SiON). In some examples, bond pad layer $112_6$ is formed from aluminum, while underlying metal layers $112_1$-$112_5$ and via layers $114_1$-$114_5$ are formed from copper. Possible advantages of forming via layers $114_1$-$114_5$ from copper are discussed below.

The number of metal layers 112 and via layers 114 shown in FIG. 1B are examples only. In other examples, IC layer stack 110 may include any other number of metal layers 112 and via layers 114. In addition, in some examples, IC layer stack 110 may be defined by a selected set of metal layers 112 and via layers 114 at any depth below the top of the IC device 100 (in the z-direction).

Still referring to FIG. 1B, the example metal interconnect arrangement 104 includes multiple interconnect elements 105 including (a) a bond pad 120 formed in bond pad layer $112_6$, (b) at least one metal layer interconnect element 122 formed in each metal interconnect layer $112_1$-$112_5$, and (c) at least one interconnect via 124 formed in each via layer $114_1$-$114_5$ and conductively connecting metal layer interconnect elements 122 of vertically adjacent metal interconnect layers $112_1$-$112_5$ (e.g., interconnect vias 124 formed in via layer $114_3$ conductively connects the respective metal layer interconnect elements 122 in vertically adjacent metal interconnect layers $112_3$ and $112_4$).

In the illustrated example, the cross-sectional plane $P_{2B}$ passes through the bond pad 120, the metal layer interconnect elements 122, and the interconnect vias 124 in each respective IC layer 111 of the IC layer stack 110. In other examples, the metal interconnect arrangement 104 may include multiple interconnect elements 105 formed at various lateral locations in the x-direction and/or y-direction (instead of being aligned in a common vertical plane as in the example of FIG. 1B).

The example integrated inductor 102 includes an inductor wire 130 having a spiral shape (as best shown in FIG. 1A) defining a magnetic B-field extending parallel to the substrate 116, which may reduce substrate loss as compared with integrated inductors having magnetic B-field extending orthogonal to the device substrate.

The inductor wire 130 includes multiple wire segments $132_1$-$132_n$ connected in series to form a spiral shape. At least some wire segments $132_1$-$132_n$ may be defined by an inductor element stack including multiple conductive inductor elements 133, including metal layer inductor elements 134 and via layer inductor elements 136, formed in a group of multiple vertically-adjacent IC layers 111. In some examples, at least some wire segments $132_1$-$132_n$ include (a) a respective metal layer inductor element 134 formed in at least one respective metal layer 112 and (b) a respective via layer inductor element 136 formed in at least one respective via layer 114. In some examples, at least some wire segments $132_1$-$132_n$ include (a) respective metal layer inductor elements 134 formed in at least two respective metal layers 112 and (b) respective via layer inductor elements 136 formed in at least two respective via layers 114.

The cross-section view of FIG. 1B (through plane $P_{2B}$ shown in FIG. 1A) shows five wire segments $132_1$-$132_5$ of the inductor wire 130 of integrated inductor 102. As shown:
(a) an inductor terminal wire segment $132_1$ is defined by a metal layer inductor element $134_{6a}$ formed in bond pad layer $112_6$;
(b) a first vertically-extending wire segment $132_2$ wire segment is defined by an inductor element stack $138_2$ of conductively connected inductor elements 133 including (i) via layer inductor elements $136_{3a}$, $136_{4a}$, and $136_{5a}$ formed in via layers $114_3$, $114_3$, and $114_5$, respectively and (ii) metal layer inductor elements $134_{4a}$ and $134_{5a}$ formed in metal layer $112_4$, and $112_5$, respectively;
(c) a laterally-extending lower wire segment $132_3$ wire segment is defined by an inductor element stack $138_3$ of conductively connected inductor elements 133 including (i) metal layer inductor elements $134_1$, $134_2$, and $134_3$ formed in metal layer $112_1$, $112_2$, and $112_3$, respectively, and (ii) via layer inductor elements $136_1$ and $136_2$ formed in via layers $114_1$ and $114_2$, respectively;
(d) a second vertically-extending wire segment $132_4$ wire segment is defined by an inductor element stack $138_4$ including (i) via layer inductor elements $136_{3b}$, $136_{4b}$, and $136_{5b}$ formed in via layers $114_3$, $114_3$, and $114_5$, respectively and (ii) metal layer inductor elements $134_{4b}$ and $134_{5b}$ formed in metal layer $112_4$, and $112_5$, respectively; and
(e) a laterally-extending upper wire segment $132_5$ wire segment is defined by a metal layer inductor element $134_{6b}$ formed in bond pad layer $112_6$.

In some examples, the inductor wire 130 exhibits low resistance characteristics. For example, in some examples the inductor wire 130 has a sheet resistance of less than 10 mΩ/sq. In some examples, the inductor wire 130 has a sheet resistance of less than 3 mΩ/sq.

In some examples, the low resistance characteristics of the inductor wire 130 are defined at least by the wire thickness of the inductor wire 130. The wire thickness of an inductor wire (e.g., inductor wire 130) may be defined by specified dimensions of the inductor wire in a plane orthogonal to a current path along the inductor wire, referred to as a "current-orthogonal plane." (FIG. 1B shows the current path CP through a portion of inductor wire 130.). For example, the wire thickness of an inductor wire may be defined by (a) an area in the current-orthogonal plane and/or (b) a length in each of two orthogonal directions in the current-orthogonal plane.

In some examples, the inductor wire 130 has an area of at least 1 μm² in the current-orthogonal plane along the full length of the inductor wire 130 (i.e., from wire segment $132_1$ to wire segment $132_n$). In some examples, the inductor wire 130 has a length of at least 1 μm in each of two orthogonal directions in the current-orthogonal plane, along the full length of the inductor wire 130 (i.e., from wire segment $132_1$ to wire segment $132_n$).

For example, for each of the wire segments $132_2$ and $132_4$ (first and second vertically-extending wire segments), the current-orthogonal plane corresponds with the x-y plane. Each wire segment $132_2$ and $132_4$ may have (a) an area of at least 1 μm² in the current-orthogonal plane (x-y plane) and/or (b) a length of at least 1 μm in each of the x-direction and y-direction (i.e., two orthogonal directions in the current-orthogonal plane (x-y plane)), along the full elongated length of each respective wire segment $132_2$ and $132_4$.

As another example, for wire segment $132_3$ (laterally-extending lower wire segment), the current-orthogonal plane corresponds with the y-z plane. Wire segment $132_3$ may have (a) an area of at least 1 μm² in the current-orthogonal plane (y-z plane) and/or (b) a length of at least 1 μm in each of the y-direction and z-direction (i.e., two orthogonal directions in the current-orthogonal plane (y-z plane)), along the full elongated length of the wire segment $132_3$.

As another example, for wire segment $132_5$ (laterally-extending upper section), the current-orthogonal plane is orthogonal to the current path CP along wire segment $132_5$, indicated as COP in FIG. 1A. Wire segment $132_5$ may have (a) an area of at least 1 μm² in the current-orthogonal plane COP and/or (b) a length of at least 1 μm in each of two orthogonal directions in the current-orthogonal plane COP, along the full elongated length of the wire segment $132_5$.

With reference to FIG. 1B, in some examples each conductive inductor element 133, including each metal layer inductor element 134 and each via layer inductor element 136, has a length of at least 1 μm in both the x-direction and y-direction, or a length of at least 2 μm in both the x-direction and y-direction, depending on the particular example.

As discussed below with reference to FIGS. 5A-8G, via layer inductor elements 136 may be formed concurrently with interconnect vias 124, wherein each via layer inductor element 136 has a length of at least 1 μm (or at least 2 μm) in both the x-direction and y-direction, while each interconnect via 124 has a length of less than 0.5 μm in both the x-direction and y-direction.

In some examples, each pair of vertically-adjacent inductor elements 133 of the inductor wire 130 have an area of conductive contact ($A_{CC}$) with each other of at least 1 μm² and/or or a length of at least 1 μm in each of two orthogonal directions in a plane of the contact area. For example, as shown in FIGS. 1A-1B collectively, an area of conductive contact $A_{CC}$ between metal inductor element $134_{4a}$ and via layer inductor element $136_{4a}$ may have an area of at least 1 μm² and/or or a length of at least 1 μm in both the x-direction and y-direction.

As noted above, in some examples the bond pad layer $112_6$ may be formed from aluminum, while both the metal layers $112_1$-$112_5$ and via layers $114_1$-$114_5$ below the bond pad layer $112_6$ may be formed from copper or other metal suitable for interconnect. In many conventional IC devices, interconnect vias are formed from tungsten, which is suitable for the size and shape of conventional vias, e.g., vertically-elongated structures with a length of less than 0.5 μm in at least one lateral direction (e.g., x-direction and/or y-direction). However, tungsten may be unsuitable for filling larger openings, e.g., wide openings for forming via layer inductor elements 136, e.g., having a length of at least 1 μm in at least one lateral direction, as discussed above. Tungsten fills in a conformal manner, which creates high tensile stresses in larger fill structures (e.g., via layer inductor elements 136), potentially resulting in tungsten peeling or breakage of the wafer on which the IC device 100 is formed. In contrast, copper fills in a bottom-up manner, suitable for filling larger openings (e.g., wide openings for forming via layer inductor elements 136). Thus, in some examples forming vias 124 and via layer inductor elements 136 from copper may reduce potential problems associated with tungsten or other conformal metal.

Figure 2A:
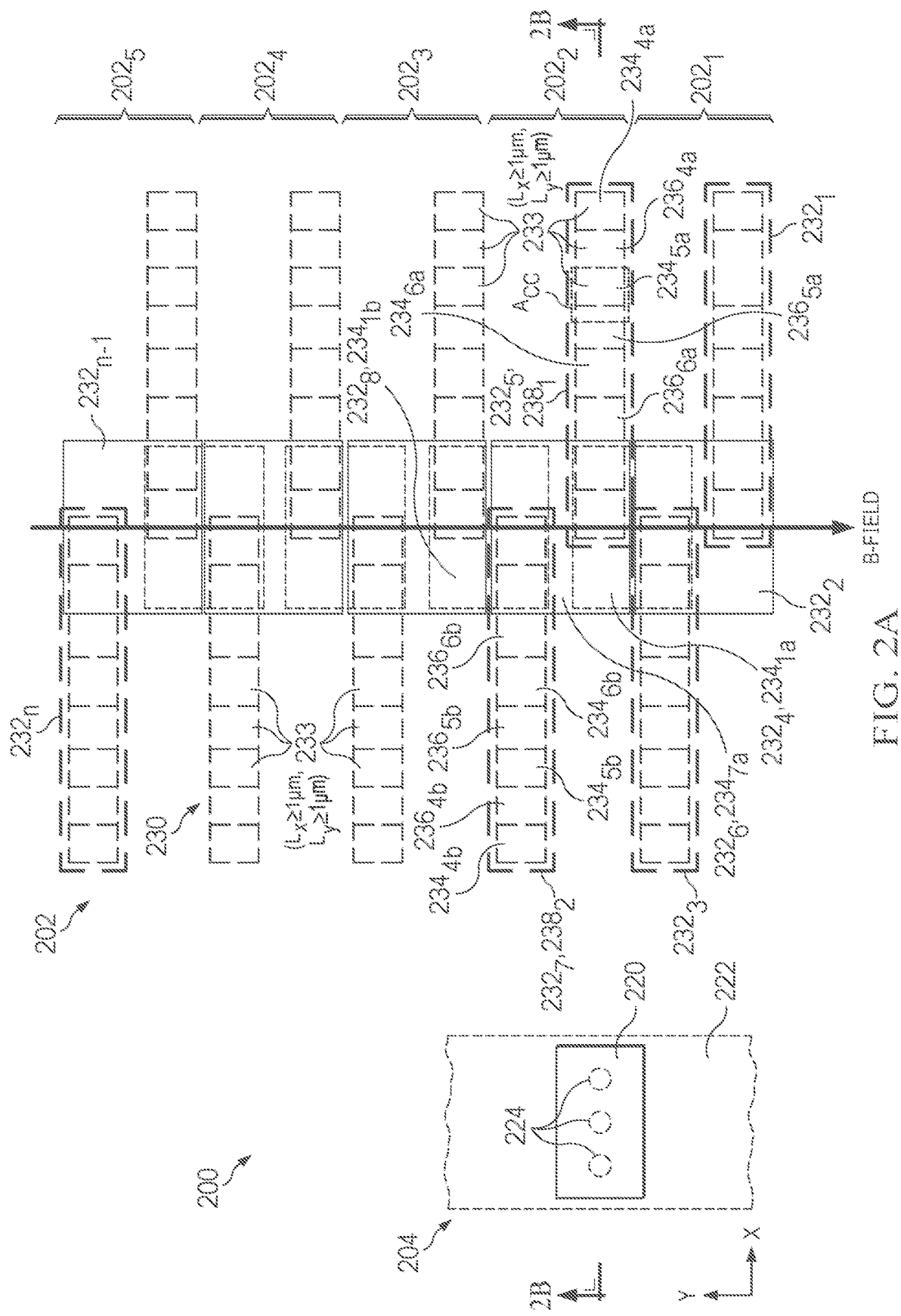
FIGS. 2A and 2B show an IC device including another example integrated inductor and an example metal interconnect arrangement.
Figure 2B:
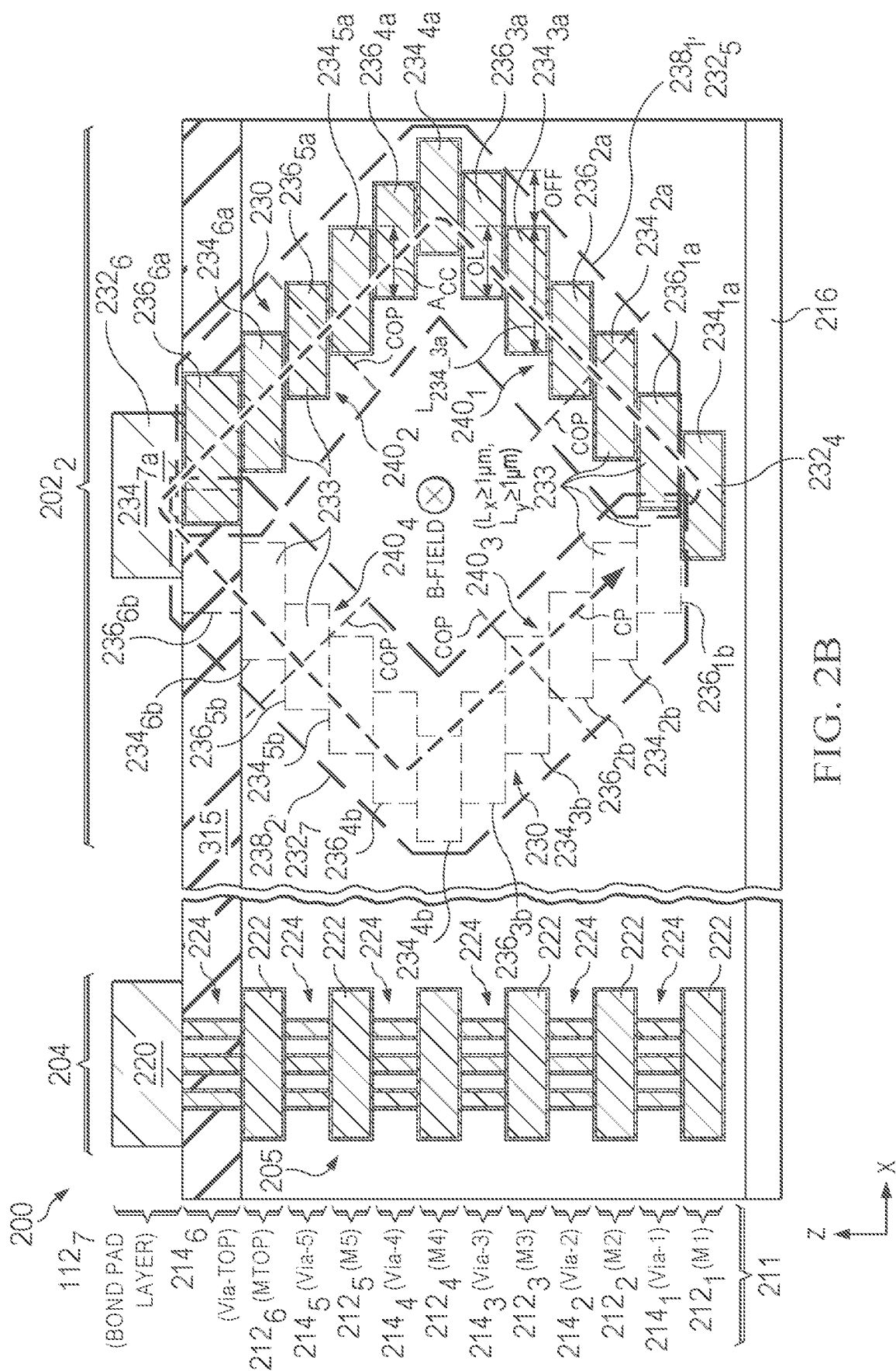

FIGS. 2A and 2B show an IC device 200 including another example integrated inductor 202 and an example metal interconnect arrangement 204. FIG. 2A shows a top view of IC device 200, and FIG. 2B shows a side cross-sectional view of IC device 200 through cut line 2B-2B shown in FIG. 2A.

With reference to FIG. 2A, integrated inductor 202 is a spiral inductor including an inductor wire 230 having five inductor wire coils $202_1$-$202_5$ and generating a magnetic B-field extending parallel to the substrate 216, which may reduce substrate loss as compared with integrated inductors having magnetic B-field extending orthogonal to the device substrate.

With reference to FIGS. 2A and 2B, inductor wire 230 may include multiple wire segments $232_1$-$232_n$ connected in series to form a spiral shape. At least some wire segments $232_1$-$232_n$ may be defined by an inductor element stack including multiple conductive inductor elements 233, including metal layer inductor elements 234 and via layer inductor elements 236, formed in a group of multiple vertically-adjacent IC layers 211. In some examples, at least some wire segments $232_1$-$232_n$ include (a) a respective metal layer inductor element 234 formed in at least one respective metal layer 212 and (b) a respective via layer inductor element 236 formed in at least one respective via layer 214. As discussed below in more detail, in the illustrated example, wire segments $232_1$-$232_n$ of inductor wire 230 include each of the following:

(a) laterally-extending upper wire segments (e.g., wire segments $232_2$, $232_6$, and $232_n$) formed in a bond pad layer $212_7$, for example wire segment $232_6$ defined by metal layer inductor element $234_{7a}$, as shown in FIG. 2B;

(b) laterally-extending lower wire segments (e.g., wire segments $232_4$ and $232_8$) formed in a lower metal layer $212_1$, for example wire segment $232_4$ defined by metal layer inductor element $234_{1a}$, as shown in FIG. 2B; and (c) vertically-extending wire segments (e.g., wire segments $232_1$, $232_3$, $232_5$, $232_7$, and $232_n$) conductively connecting selected laterally-extending upper wire segments with selected laterally-extending lower wire segments. For example, vertically-extending wire segment $232_3$ connects laterally-extending upper wire segment $232_2$ with laterally-extending lower wire segment $232_4$; vertically-extending wire segment $232_5$ connects laterally-extending lower wire segment $232_4$ with laterally-extending upper wire segment $232_6$; and vertically-extending wire segment $232_7$ connects laterally-extending upper wire segment $232_6$ with laterally-extending lower wire segment $232_8$. As shown in FIG. 2B discussed below, each vertically-extending wire segment (e.g., wire segments $232_1$, $232_3$, $232_5$, $232_7$, and $232_n$) may be defined by a respective inductor element stack 238 of conductively connected inductor elements 233 including at least one via layer inductor elements 236 formed in at least one respective via layer 114 and at least one metal layer inductor element 234 formed in at least one respective metal layer 112.

The cross-sectional view of FIG. 2B shows a selected inductor wire coil $202_2$ along with the example metal interconnect arrangement 204. As shown in FIG. 2B, IC device 200 includes an IC layer stack 210 formed over a substrate 216, e.g., a silicon substrate, extending in an x-y plane (e.g., perpendicular to the z-direction). The IC layer stack 210 may be formed directly on the substrate 216, or IC device 200 may include any number of intervening layers or structures (not shown) between the substrate 216 and the bottom of the IC layer stack 210.

The IC layer stack 210 includes a stack of IC layers 211 including multiple metal layers $212_1$-$212_7$ and multiple via layers $214_1$-$214_6$ formed in an alternating manner in a vertical direction (z-direction), with respective via layers 214 located between a respective pair of metal layers 212. Metal layers $212_1$-$212_7$ and via layers $214_1$-$214_6$ are also referred to as metal layers 212 and via layers 214, respectively, for convenience.

In this example, metal layers $212_1$-$212_6$ are metal interconnect layers (referred to as M1, M2, M3, M4, M5, and MTOP, respectively) and metal layer $212_7$ is a bond pad layer, and via layers $214_1$-$214_6$ are interconnect via layers. Via layer $214_6$ (Via-top layer) may be formed in a passivation layer 215.

The number of metal layers 212 and via layers 214 shown in FIG. 2B are examples only. In other examples, IC layer stack 210 may include any other number of metal layers 212 and via layers 214. In addition, in some examples, IC layer stack 210 may be defined by a selected set of metal layers 212 and via layers 214 at any depth below the top of the IC device 200 (in the z-direction).

In some examples, the bond pad layer $212_7$ may be formed from aluminum, while the underlying metal layers $212_1$-$212_6$ and via layers $214_1$-$214_6$ may be formed from copper or other metal suitable for interconnect.

Still referring to FIG. 2B, the example metal interconnect arrangement 204 includes multiple interconnect elements 205 including (a) a bond pad 220 formed in bond pad layer $212_7$, (b) at least one metal layer interconnect element 222 formed in each metal interconnect layer $212_1$-$212_6$, and (c) at least one interconnect via 224 formed in each via layer $214_1$-$214_6$ and conductively connecting metal layer interconnect elements 222 of vertically adjacent metal interconnect layers $212_1$-$212_6$ (e.g., interconnect vias 224 formed in via layer $214_4$ conductively connects the respective metal layer interconnect elements 222 in vertically adjacent metal interconnect layers $212_4$ and $212_5$).

In the illustrated example, the cross-sectional cut line 2B-2B (shown in FIG. 2A) cuts through the bond pad 220, the metal layer interconnect elements 222, and the interconnect vias 224 in each IC layer 211 of the IC layer stack 210. In other examples, the metal interconnect arrangement 204 may include multiple interconnect elements 205 formed at various lateral locations in the x-direction and/or y-direction (instead of being aligned in a common vertical plane as in the example of FIG. 2B).

As shown in FIG. 2B, inductor wire coil $202_2$ includes (a) a first inductor element stack $238_1$ defining vertically-extending wire segment $232_5$ and (b) a second inductor element stack $238_2$ defining vertically-extending wire segment $232_7$ and offset from the first inductor element stack $238_1$ in the y-direction. As shown, first inductor element stack $238_1$ (defining vertically-extending wire segment $232_5$) is connected between the metal layer inductor element $234_{1a}$ (defining laterally-extending lower wire segment $232_4$) formed in metal layer $212_1$ and the metal layer inductor element $234_{7a}$ (defining laterally-extending upper wire segment $232_6$) formed in bond pad layer $212_7$. Similarly, second inductor element stack $238_2$ (defining vertically-extending wire segment $232_7$) is connected between metal layer inductor element $234_{7a}$ (defining laterally-extending upper wire segment $232_6$) formed in bond pad layer $212_7$ and a metal layer inductor element $234_{1b}$ (visible in FIG. 2A) formed in metal layer $212_1$ (wherein metal layer inductor element $234_{1b}$ defines a laterally-extending lower wire segment $232_8$).

Each of the first inductor element stack $238_1$ (vertically-extending wire segment $232_5$) and second inductor element stack $238_2$ (vertically-extending wire segment $232_7$) includes a stack of conductively-connected inductor elements 233, including metal layer inductor elements 234 and via layer inductor elements 236, formed in a group of multiple vertically-adjacent IC layers 211. As shown, the conductively-connected metal layer inductor elements 234 and via layer inductor elements 236 in each inductor element stack $238_1$ and $238_2$ may be formed laterally offset from each other in the x-direction, as discussed in more detail below.

In the illustrated example, the first inductor element stack $238_1$ includes conductively connected inductor elements 233 including metal layer inductor elements $234_{2a}$-$234_{6a}$ formed respectively in metal layers $212_2$-$212_6$ and via layer inductor elements $236_{1a}$-$236_{6a}$ formed respectively in via layers $214_1$-$214_6$. As shown, the conductively connected inductor elements 233 in the first inductor element stack $238_1$ (including metal layer inductor elements $234_{2a}$-$234_{6a}$ and via layer inductor elements $236_{1a}$-$236_{6a}$) are formed laterally offset from each other in the x-direction to define two diagonally-extending wire segments $240_1$ and $240_2$, each extending both vertically and laterally (i.e., diagonally) with respect to the vertical z-direction.

Similarly, the second inductor element stack $238_2$ includes conductively connected inductor elements 233 including metal layer inductor elements $234_{2b}$-$234_{6b}$ formed respectively in metal layer $212_2$-$212_6$ and via layer inductor elements $236_{1b}$-$236_{6b}$ formed respectively in via layers $214_1$-$214_6$. As shown, the conductively connected inductor elements 233 in the second inductor element stack $238_2$ (including metal layer inductor elements $234_{2b}$-$234_{6b}$ and via layer inductor elements $236_{1b}$-$236_{6b}$) are formed laterally offset from each other in the x-direction to define two diagonally-extending wire segments $240_3$ and $240_4$, each extending diagonally with respect to the z-direction (vertical).

In the illustrated example, each respective inductor element 233 in the first inductor element stack $238_1$ is laterally offset (in the x-direction) from the vertically-adjacent inductor element 233 underlying the respective inductor element 233 (i.e., the inductor element 233 formed in the adjacent IC layer 211 below the respective inductor element 233). For example, via layer inductor element 2362a is laterally offset (in the x-direction) from the vertically-adjacent metal layer inductor element $234_{2a}$ underlying via layer inductor element $236_{3a}$.

Similarly, each respective inductor element 233 in the second inductor element stack $238_2$ is laterally offset (in the x-direction) from the vertically-adjacent inductor element 233 underlying the respective inductor element 233. For example, metal layer inductor element $234_{5b}$ is laterally offset (in the x-direction) from the vertically-adjacent via layer inductor element $236_{4b}$ underlying metal layer inductor element $234_{5b}$.

As used herein, a first inductor element 233 is "laterally offset" (in the x-direction) from an underlying second inductor element 233 if the first inductor element 233 extends laterally beyond the length (x-direction) of the underlying second inductor element 233 by a distance of at least 10% of the length (x-direction) of the underlying second inductor element 233. For example, with reference to FIG. 2B, via layer inductor element $236_{3a}$ is "laterally offset" from underlying metal layer inductor element $234_{3a}$ if via layer inductor element $236_{3a}$ extends beyond the length of the underlying metal layer inductor element $234_{3a}$ in the x-direction by an offset distance "OFF" of at least 10% of the lateral x-direction length $L_{234\_3a}$ of underlying metal layer inductor element $234_{3a}$. As shown, via layer inductor element $236_{3a}$ overlaps underlying metal layer inductor element $234_{3a}$ in the x-direction by an overlap distance "OL."

In some examples, at least some (or all) of the respective inductor element 233 in the first inductor element stack $238_1$ are laterally offset (in the x-direction) from the vertically-adjacent inductor element 233 underlying the respective inductor element 233 in the first inductor element stack $238_1$ by at least 20%, at least 30%, at least 40%, or at least 50%, depending on the particular implementation. Similarly, in some examples, at least some (or all) of the respective inductor element 233 in the second inductor element stack $238_2$ are laterally offset (in the x-direction) from the vertically-adjacent inductor element 233 underlying the respective inductor element 233 in the second inductor element stack $238_2$ by at least 20%, at least 30%, at least 40%, or at least 50%, depending on the particular implementation.

In some examples, the inductor wire 230 exhibits low resistance characteristics. For example, in some examples the inductor wire 230 has a sheet resistance of less than 10 mΩ/sq. In some examples, the inductor wire 230 has a sheet resistance of less than 3 mΩ/sq.

In some examples, the low resistance characteristics of the inductor wire 230 are defined at least by the wire thickness of the inductor wire 230. As discussed above regarding inductor wire 130, the wire thickness of inductor wire 230 may be defined by specified dimensions of the inductor wire in the current-orthogonal plane COP, e.g., (a) an area in the current-orthogonal plane and/or (b) a length in each of two orthogonal directions in the current-orthogonal plane.

In some examples, the inductor wire 230 has an area of at least 1 µm² in the current-orthogonal plane COP along the full length of the inductor wire 230 (i.e., along coils $202_1$-$202_5$). In some examples, the inductor wire 230 has a length of at least 1 µm in each of two orthogonal directions in the current-orthogonal plane COP, along the full length of the inductor wire 230.

In some examples, each pair of vertically-adjacent inductor elements 233 of the inductor wire 230 has an area of conductive contact ($A_{CC}$) with each other of at least 1 µm² and/or or a length of at least 1 µm in each of two orthogonal directions in a plane of the contact area. For example, as shown in FIGS. 2A-2B, an area of conductive contact $A_{CC}$ between via layer inductor element $236_{4a}$ and adjacent metal inductor element $234_{5a}$ may have an area of at least 1 µm² and/or or a length of at least 1 µm in both the x-direction and y-direction.

With reference to FIG. 2B, in some examples each conductive inductor element 233, including each metal layer inductor element 234 and each via layer inductor element 236, has a length of at least 1 µm in both the x-direction and y-direction, or a length of at least 2 µm in both the x-direction and y-direction, depending on the particular example. As discussed below with reference to FIGS. 5A-8G, via layer inductor elements 236 may be formed concurrently with interconnect vias 224, wherein each via layer inductor element 236 has a length of at least 1 µm (or at least 2 µm) in both the x-direction and y-direction, while each interconnect via 224 has a length of less than 0.5 µm in both the x-direction and y-direction.

Figure 3A:
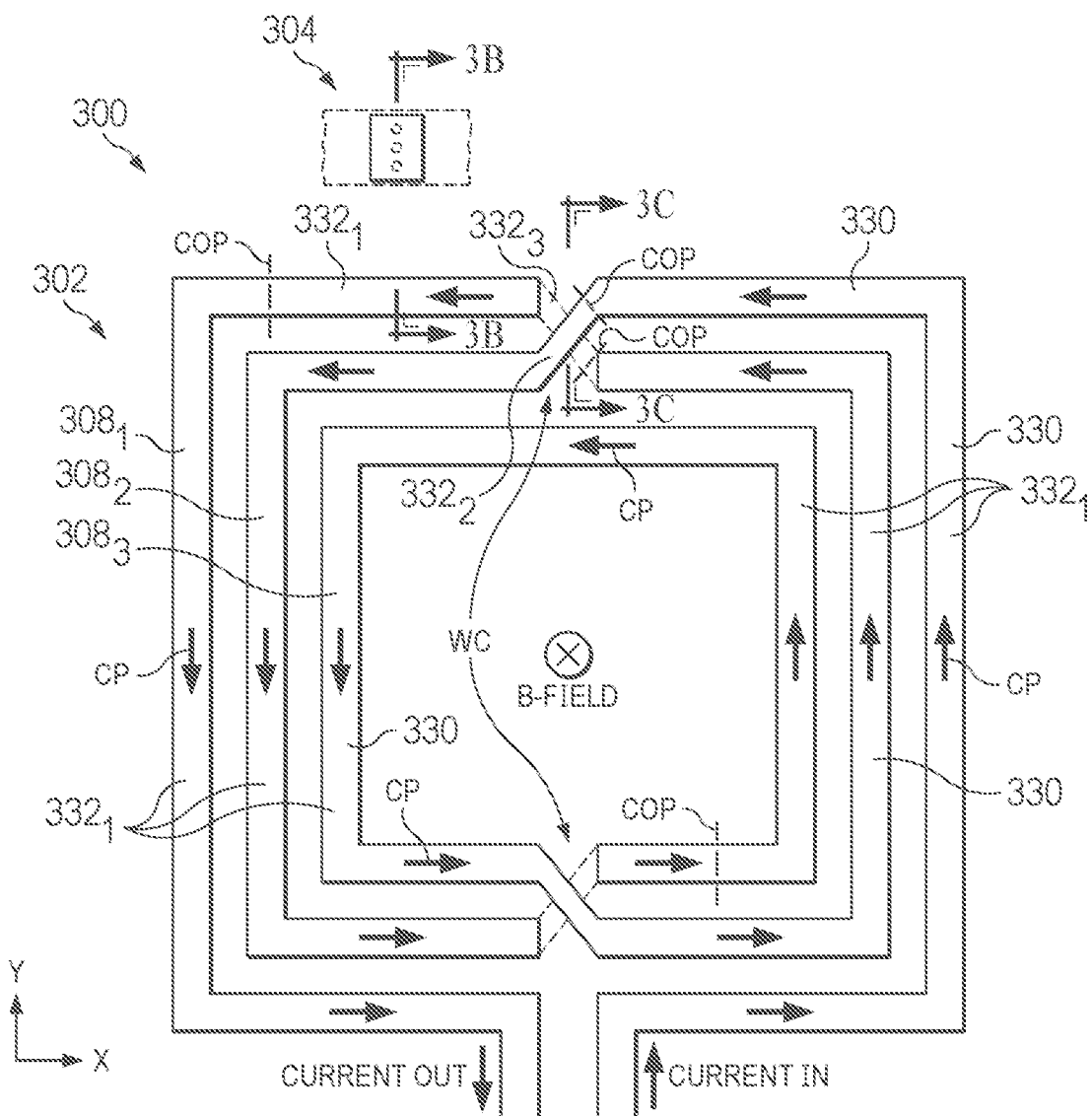
FIGS. 3A-3C show an IC device including an example spiral integrated inductor and an example metal interconnect arrangement.
Figure 3B:
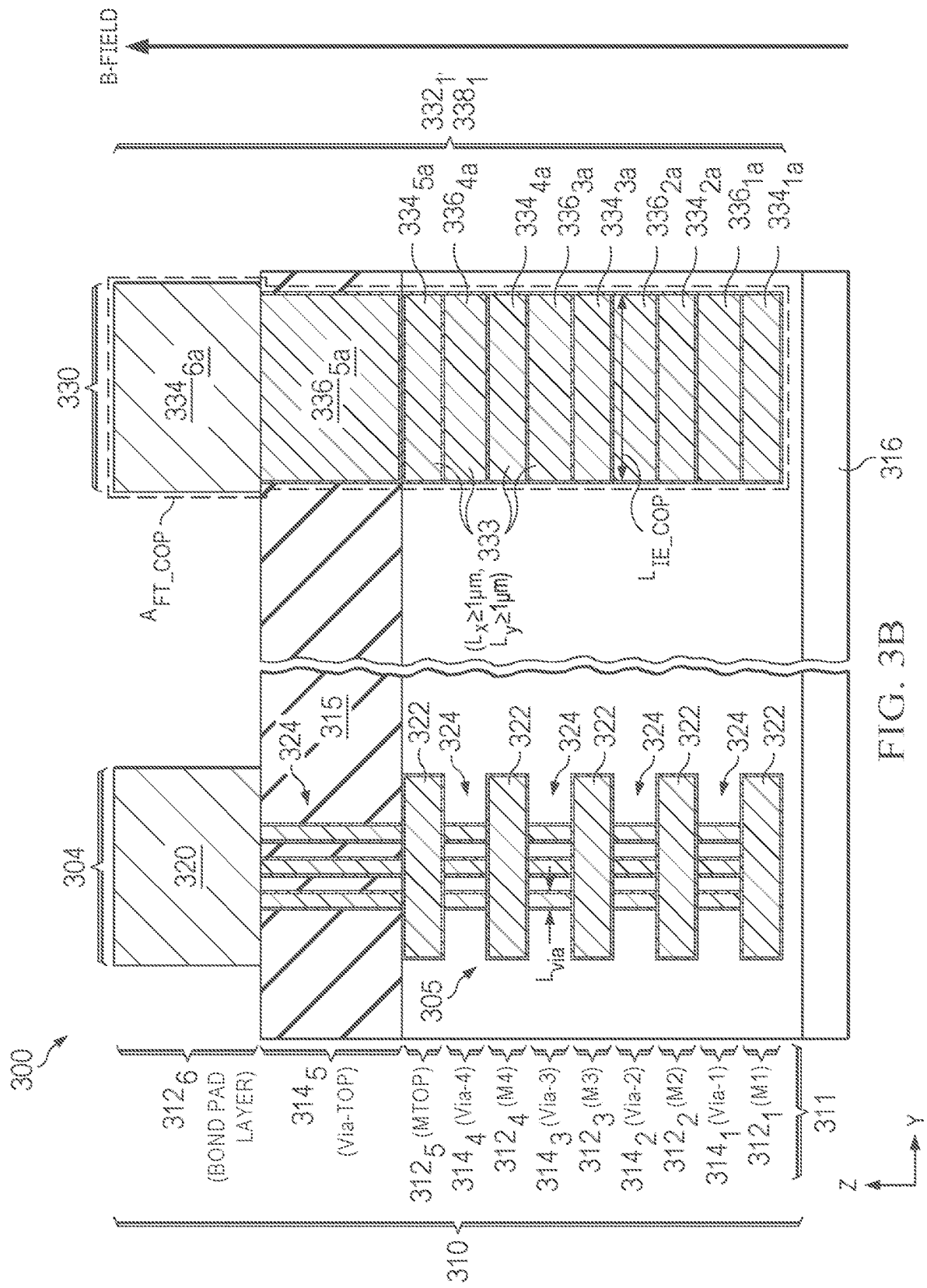
Figure 3C:
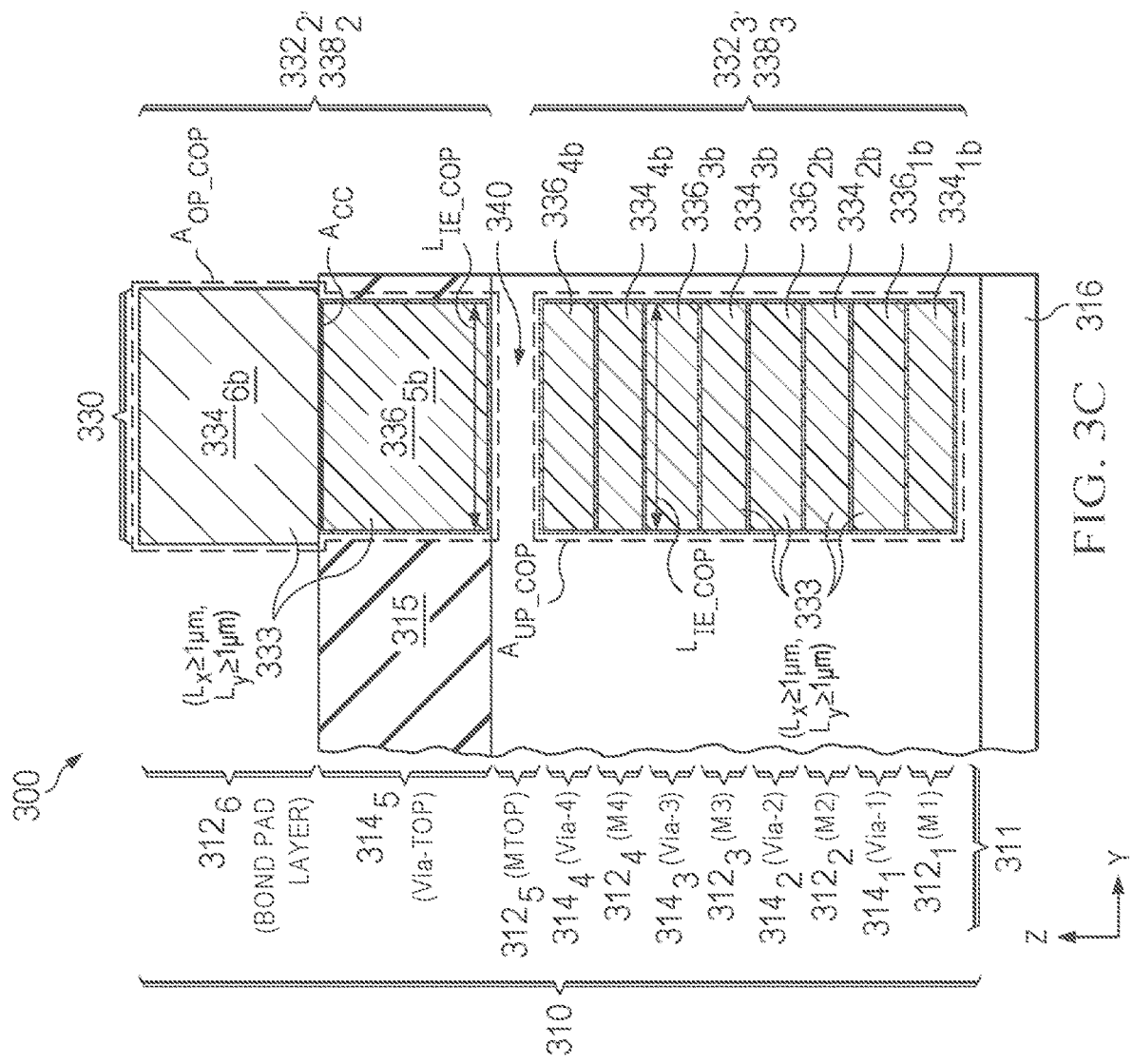

FIGS. 3A-3C show an IC device 300 including another example integrated inductor 302 having a spiral inductor wire 330, and an example metal interconnect arrangement 304. FIG. 3A shows a top view of IC device 300, showing the spiral inductor wire 330 of the integrated inductor 302, along with the example metal interconnect arrangement 304. As shown, the spiral inductor wire 330 includes three coils $308_1$-$308_3$ defining a spiral shape in the x-y plane, and a wire thickness in the z-direction (which wire thickness is more clearly shown in FIGS. 3B and 3C, discussed below). The spiral inductor wire 330 crosses over itself at two locations referred to as wire crossover ("WC") locations. The spiral inductor wire 330 has a split-wire construction at each wire crossover location, and a full-thickness construction outside the wire crossover locations.

FIG. 3B shows a side cross-sectional view through cut line 3B-3B shown in FIG. 3A, showing the full-thickness construction of the spiral inductor wire 330 at a first location, along with the metal interconnect arrangement 304. FIG. 3C shows a side cross-sectional view through cut line 3C-3C shown in FIG. 3A, showing the split-wire structure of the spiral inductor wire 330 at a wire crossover location. As shown in FIGS. 3A-3C, the arrangement of the spiral inductor wire 330 of integrated inductor 302 generates a magnetic B-field extending perpendicular to an underlying substrate 316.

As shown in FIG. 3B, IC device 300 includes an IC layer stack 310 formed over substrate 316, e.g., a silicon substrate, extending in the x-y plane. The IC layer stack 310 may be formed directly on the substrate 316, or IC device 300 may include any number of intervening layers or structures (not shown) between the substrate 316 and the bottom of the IC layer stack 310.

The IC layer stack 310 includes a stack of IC layers 311 including multiple metal layers $312_1$-$312_6$ and multiple via layers $314_1$-$314_5$ formed in an alternating manner in a vertical direction (z-direction), with each via layer 314 located between a respective pair of metal layers 312. Metal layers $312_1$-$312_6$ and via layers $314_1$-$314_5$ are also referred to as metal layers 312 and via layers 314, respectively, for convenience.

In this example, metal layers $312_1$-$312_5$ are metal interconnect layers (referred to as M1, M2, M3, M4, M5, and MTOP, respectively) and metal layer $312_6$ is a bond pad layer, and via layers $314_1$-$314_6$ are interconnect via layers. Via layer $314_5$ (Via-top layer) may be formed in a passivation layer 315.

The number of metal layers 312 and via layers 314 shown in FIG. 3B are examples only. In other examples, IC layer stack 310 may include any other number of metal layers 312 and via layers 314. In addition, in some examples, IC layer stack 310 may be defined by a selected set of metal layers 312 and via layers 314 at any depth below the top of the IC device 300 (in the z-direction).

In some examples, the bond pad layer $312_6$ may be formed from aluminum, while the underlying metal layers $312_1$-$312_5$ and via layers $314_1$-$314_5$ may be formed from copper or other metal suitable for interconnect.

Still referring to FIG. 3B, the example metal interconnect arrangement 304 includes multiple interconnect elements 305 including (a) a bond pad 320 formed in bond pad layer $312_6$, (b) at least one metal layer interconnect element 322 formed in each metal interconnect layer $312_1$-$312_5$, and (c) at least one interconnect via 324 formed in each via layer $314_1$-$314_5$ and conductively connecting metal layer interconnect elements 322 of vertically adjacent metal interconnect layers $312_1$-$312_5$ (e.g., interconnect vias 324 formed in via layer 3143 conductively connects the respective metal layer interconnect elements 322 in vertically adjacent metal interconnect layers $312_3$ and $312_4$).

As mentioned above, at locations other than the crossover locations WC, which non-crossover locations referred to as full-thickness coil wire segments $332_1$, a thickness of the inductor wire 330 in the z-direction is defined by a first inductor element stack $338_1$ formed in the IC layer stack 310, as shown in FIG. 3B. The first inductor element stack $338_1$ includes a stack of conductively-connected inductor elements 333, including metal layer inductor elements $334_{1a}$-$334_{6a}$ formed respectively in metal layers $312_1$-$312_6$ and via layer inductor elements $336_{1a}$-$336_{5a}$ formed respectively in via layers $314_1$-$314_5$.

As mentioned above, FIG. 3C shows a cross-sectional view of the split-wire structure of the inductor wire 330 at a wire crossover location WC (shown in FIG. 3A). The split-wire structure of inductor wire 330 includes (a) a WC overpass wire segment $332_2$ defined by a second inductor element stack $338_2$ and a WC underpass wire segment $332_3$ defined by a third inductor element stack $338_3$, wherein each of the second inductor element stack $338_2$ and third inductor element stack $338_3$ includes a stack of conductively-connected inductor elements 333 formed in selected IC layers 311 of the IC layer stack 310. In particular, second inductor element stack $338_2$ includes via layer inductor element $336_{5b}$ formed Top-via layer $314_5$ and metal layer inductor element $334_{6b}$ formed in bond pad layer $312_6$, and third inductor element stack $338_3$ includes metal layer inductor elements $334_{1b}$-$334_{4b}$ formed respectively in metal layers $312_1$-$312_4$ and via layer inductor elements $336_{1b}$-$336_{4b}$ formed respectively in via layers $314_1$-$314_4$. The second inductor element stack $338_2$ and third inductor element stack $338_3$ are physically separated and conductively insulated from each other by dielectric material 340 (in metal layer $312_5$) between via layer inductor element $336_{5b}$ of the second inductor element stack $338_2$ and via layer inductor element $336_{4b}$ of the third inductor element stack $338_3$.

In other examples, the thickness (in the z-direction) of each of the first inductor element stack $338_1$ and third inductor element stack $338_3$ may span any other number of IC layers 311 in the IC layer stack 310. Further, the second and third inductor element stacks $338_2$ and $338_3$ may be physically separated (and conductively insulated) from each other by multiple IC layers 311, e.g., to provide additional electrical insulation between the WC overpass wire segment $332_2$ and WC underpass wire segment $332_3$.

In some examples, the inductor wire 330 exhibits low resistance characteristics. For example, in some examples the inductor wire 330 has a sheet resistance of less than 10 mΩ/sq. In some examples, the inductor wire 330 has a sheet resistance of less than 3 mΩ/sq.

In some examples, the low resistance characteristics of the inductor wire 330 are defined at least by the wire thickness of the inductor wire 330. As discussed above regarding inductor wires 130 and 230, the wire thickness of inductor wire 330 may be defined by specified dimensions of the inductor wire in the current-orthogonal plane COP.

With reference to FIGS. 3B and 3C, in some examples each inductor element 333 (including each metal layer inductor element 334 and each via layer inductor element 336) has a length $L_{IE\_COP}$ in the current-orthogonal plane COP (the length being orthogonal to the z-direction) of at least 1 μm along the full length of the inductor wire 330, e.g., along coils $308_1$-$408_3$ and across each wire crossover location WC. Thus, with reference to FIG. 3B, each inductor element 333 in each full-thickness coil wire segment $332_1$, each WC overpass wire segment $332_2$, and each WC underpass wire segment $332_3$ has a respective length $L_{IE\_COP}$ of at least 1 μm. In some examples, each inductor element 333

(including each metal layer inductor element 334 and each via layer inductor element 336) in each full-thickness coil wire segment $332_1$, each WC overpass wire segment $332_2$, and each WC underpass wire segment $332_3$ has a length $L_{IE\_COP}$ of at least 2 μm, while each interconnect via 324 has a corresponding a length $L_{via}$ of less than 0.5 μm in the respective COP.

In some examples, the inductor wire 330 has an area of at least 1 μm² in the current-orthogonal plane COP, referred to as the COP area, along the full length of the inductor wire 330, e.g., along coils $308_1$-$308_3$ and across each wire crossover location WC. Thus, referring to FIGS. 3B and 3C, each of (a) the COP area $A_{FT\_COP}$ of each full-thickness coil wire segment $332_1$, (b) the COP area $A_{OP\_COP}$ of each WC overpass wire segment $332_2$, and (c) the COP area $A_{UP\_COP}$ of each WC underpass wire segment $332_3$, is at least 1 μm².

Figure 4A:
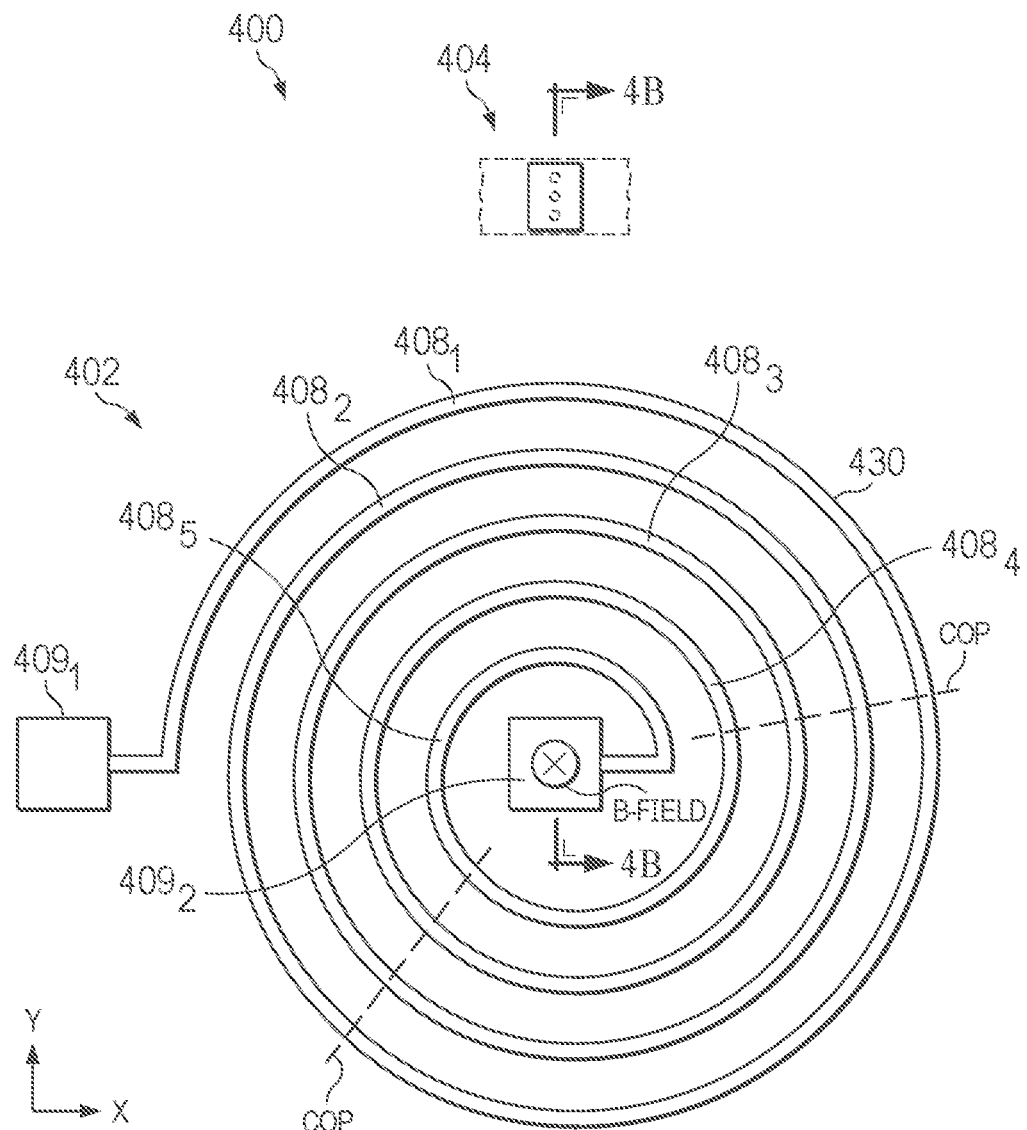
FIGS. 4A and 4B show an IC device including another example spiral integrated inductor and an example metal interconnect arrangement.
Figure 4B:
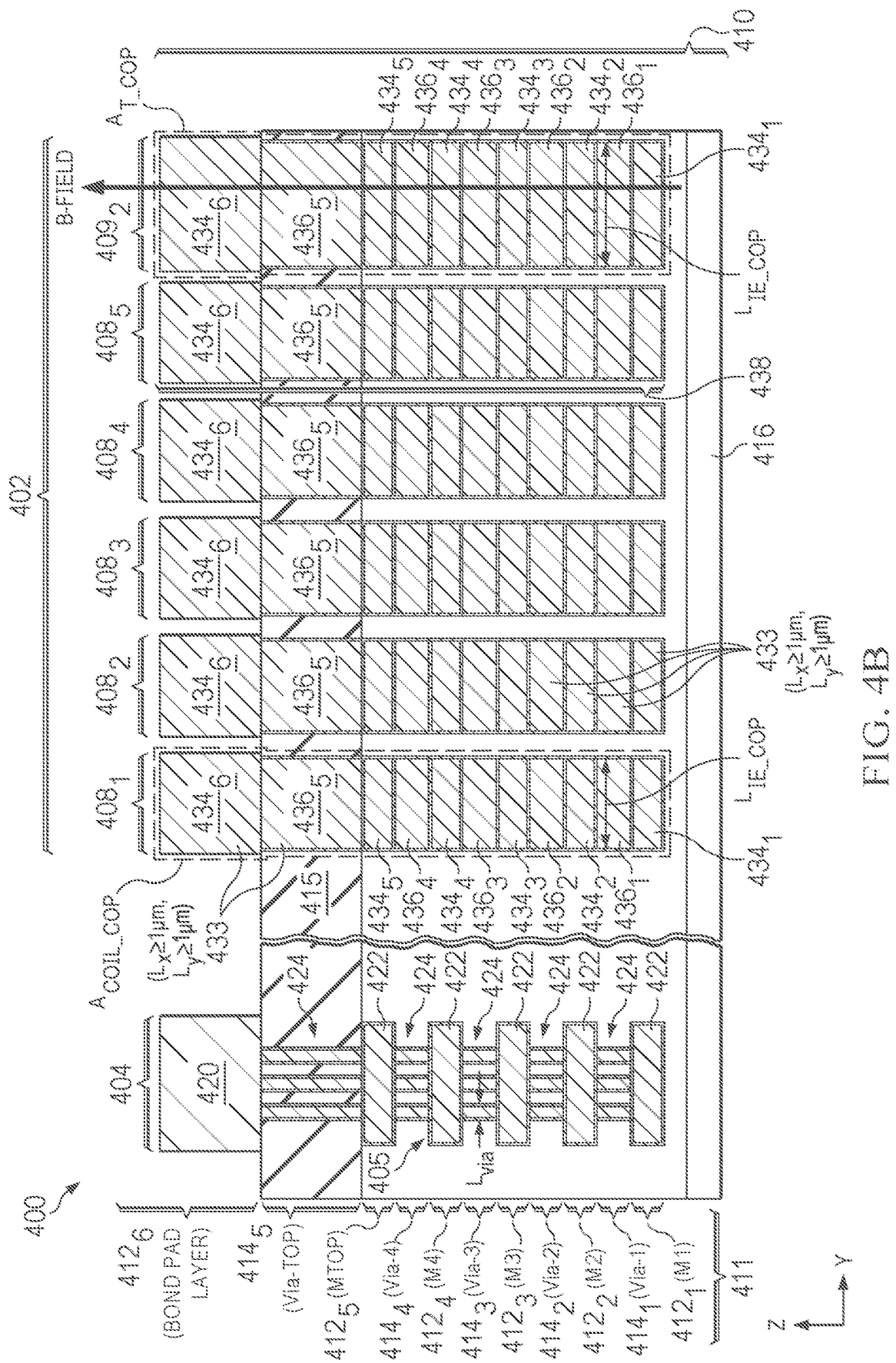

FIGS. 4A and 4B show an IC device 400 including another example spiral integrated inductor 402 and an example metal interconnect arrangement 404. FIG. 4A shows a top view of IC device 400, FIG. 4B shows a side cross-sectional view of IC device 400 through cut line 4B-4B shown in FIG. 4A. As shown in FIG. 4A, the spiral integrated inductor 402 includes an inductor wire 430 including five wire coils $408_1$-$408_5$ defining a spiral shape in the x-y plane, and a wire thickness in the z-direction. The inductor wire 430 extends between two inductor terminals $409_1$ and terminal $409_2$. FIG. 4B shows a cross-sectional view of the five wire coils $408_1$-$408_5$ and inductor terminal $409_2$ of the inductor wire 430, along with the example metal interconnect arrangement 404.

As shown in FIG. 4B, IC device 400 includes an IC layer stack 410 formed over substrate 416, e.g., a silicon substrate, extending in the x-y plane. The IC layer stack 410 may be formed directly on the substrate 416, or IC device 400 may include any number of intervening layers or structures (not shown) between the substrate 416 and the bottom of the IC layer stack 410.

The IC layer stack 410 includes a stack of IC layers 411 including multiple metal layers $412_1$-$412_6$ and multiple via layers $414_1$-$414_5$ formed in an alternating manner in a vertical direction (z-direction), with a respective via layer 414 located between a respective pair of metal layers 412. Metal layers $412_1$-$412_6$ and via layers $414_1$-$414_5$ are also referred to as metal layers 412 and via layers 414, respectively, for convenience.

In this example, metal layers $412_1$-$412_5$ are metal interconnect layers (referred to as M1, M2, M3, M4, M5, and MTOP, respectively) and metal layer $412_6$ is a bond pad layer, and via layers $414_1$-$414_6$ are interconnect via layers. Via layer $414_5$ (Via-top layer) may be formed in a passivation layer 415.

The number of metal layers 412 and via layers 414 shown in FIG. 4B are examples only. In other examples, IC layer stack 410 may include any other number of metal layers 412 and via layers 414. In addition, in some examples, IC layer stack 410 may be defined by a selected set of metal layers 412 and via layers 414 at any depth below the top of the IC device 400 (in the z-direction).

In some examples, the bond pad layer $412_6$ may be formed from aluminum, while the underlying metal layers $412_1$-$412_5$ and via layers $414_1$-$414_5$ may be formed from copper or other metal suitable for interconnect.

Still referring to FIG. 4B, the example metal interconnect arrangement 404 includes multiple interconnect elements 405 including (a) a bond pad 420 formed in bond pad layer $412_6$, (b) at least one metal layer interconnect element 422 formed in each metal interconnect layer $412_1$-$412_5$, and (c) at least one interconnect via 424 formed in each via layer $414_1$-$414_5$ and conductively connecting metal layer interconnect elements 422 of vertically adjacent metal interconnect layers $412_1$-$412_5$ (e.g., interconnect vias 424 formed in via layer 4143 conductively connects the respective metal layer interconnect elements 422 in vertically adjacent metal interconnect layers $412_3$ and $412_4$).

As noted above, FIG. 4B also shows a side cross-sectional view of the five wire coils $408_1$-$408_5$ and inductor terminal $409_2$. Each wire coil $408_1$-$408_5$ and inductor terminal $409_2$ is defined by a common inductor element stack 438 formed in the IC layer stack 410. The inductor element stack 438 includes a stack of conductively-connected inductor elements 433, including metal layer inductor elements $434_1$-$434_6$ formed respectively in metal layers $412_1$-$412_6$ and via layer inductor elements $436_1$-$436_5$ formed respectively in via layers $414_1$-$414_5$.

In some examples, the inductor wire 430 exhibits low resistance characteristics. For example, in some examples the inductor wire 430 has a sheet resistance of less than 10 mΩ/sq. In some examples, the inductor wire 430 has a sheet resistance of less than 3 mΩ/sq.

In some examples, the low resistance characteristics of the inductor wire 430 are defined at least by the wire thickness of the inductor wire 430. As discussed above regarding inductor wires 130, 330 and 430, the wire thickness of inductor wire 430 may be defined by specified dimensions of the inductor wire in the current-orthogonal plane COP.

With reference to FIG. 4B, in some examples each inductor element 433 (including each metal layer inductor element 434 and each via layer inductor element 436) has a length $L_{IE\_COP}$ in the current-orthogonal plane COP (the length being orthogonal to the z-direction) of at least 1 μm along the full length of the inductor wire 430, e.g., along coils $408_1$-$408_5$ and terminals $409_1$ and $409_2$. Thus, with reference to FIG. 4B, each inductor element 433 of inductor wire 430 has a respective length $L_{IE\_COP}$ of at least 1 μm. In some examples, each inductor element 433 (including each metal layer inductor element 434 and each via layer inductor element 436) in inductor wire 430 has a length $L_{IE\_COP}$ of at least 2 μm, while each interconnect via 424 has a corresponding a length $L_{via}$ of less than 0.5 μm in the respective COP.

In some examples, the inductor wire 430 has an area of at least 10 μm² in the current-orthogonal plane COP, referred to as the COP area, along the full length of the inductor wire 430, e.g., along coils $408_1$-$408_5$ and terminals $409_1$ and $409_2$. Thus, referring to FIG. 4B, each of (a) the COP area $A_{COIL\_COP}$ along each coils $408_1$-$408_5$ and (b) the COP area $A_{T\_COP}$ of terminal $409_2$ is at least 10 μm².

As discussed above, each of the example integrated inductors 102, 302, 402, and 402 includes a thick inductor wire defined by inductor element stacks including (a) wide metal layer inductor elements (e.g., at least 1 μm wide) and (b) wide via layer inductor elements (e.g., at least 1 μm wide). As discussed below, metal layer inductor elements may be formed concurrently with metal layer interconnect elements in respective metal interconnect layers, and via layer inductor elements may be formed concurrently with interconnect vias in respective interconnect via layers. In some examples, wide via layer inductor elements (e.g., having a length of at least 1 μm in at least one lateral direction) may be formed concurrently with conventional sized interconnect vias (e.g., having a length of less than 0.5 μm).

FIGS. 5A-5D show a series of side cross-sectional views of an example IC device 500 showing an example process for constructing a vertically-extending inductor element stack 538 (e.g., for construction of the example integrated inductor 102, 302, or 402 discussed above) concurrently with construction of a typical interconnect structure 502. The example process involves damascene process steps, as discussed below.

Figure 5A:
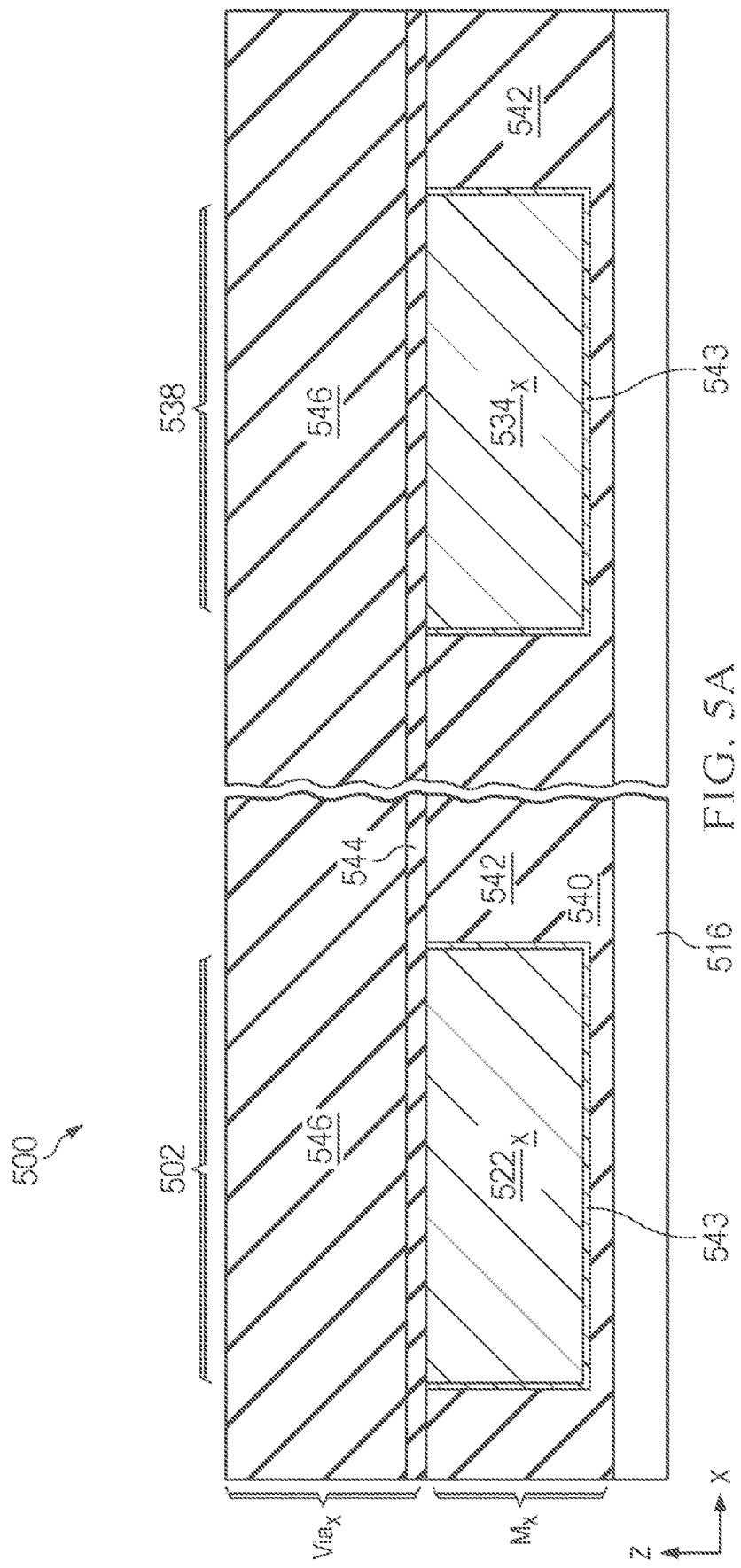
FIGS. 5A-5D show an example process for constructing a vertically-extending inductor element stack concurrently with a typical interconnect structure, using damascene process steps.

First, as shown in FIG. 5A, a metal interconnect layer $M_x$ is constructed over a substrate 516, e.g., silicon substrate. IC device 500 may include any number of intervening layers or structures 540 (including transistors and/or other IC elements) between the substrate 516 and the metal interconnect layer $M_x$, in the vertical direction (z-direction). Metal interconnect layer $M_x$ may include a metal layer interconnect element $522_x$ and a metal layer inductor element $534_x$, which may be formed concurrently in a dielectric layer 542, e.g., using a known damascene process. The metal layer inductor element $534_x$ may have a length of at least 1 μm, at least 2 μm, at least 5 μm, at least 10 μm, or at least 100 μm, in the x-direction and/or the y-direction, depending on the particular implementation. The metal layer interconnect element $522_x$ and metal layer inductor element $534_x$ may be formed from copper or other conductive material. In some examples, the metal layer interconnect element $522_x$ and metal layer inductor element $534_x$ may each be formed over a barrier layer 543, e.g., comprising a TaN/Ta bilayer.

A dielectric barrier layer 544, e.g., comprising silicon nitride (SiN) or silicon carbide (SiC) may be deposited on the metal interconnect layer $M_x$, followed by deposition of an inter-metal dielectric (IMD) layer 546, e.g., comprising silicon oxide ($SiO_2$), fluorosilicate glass (FSG), organosilicate glass (OSG), or porous OSG.

Figure 5B:
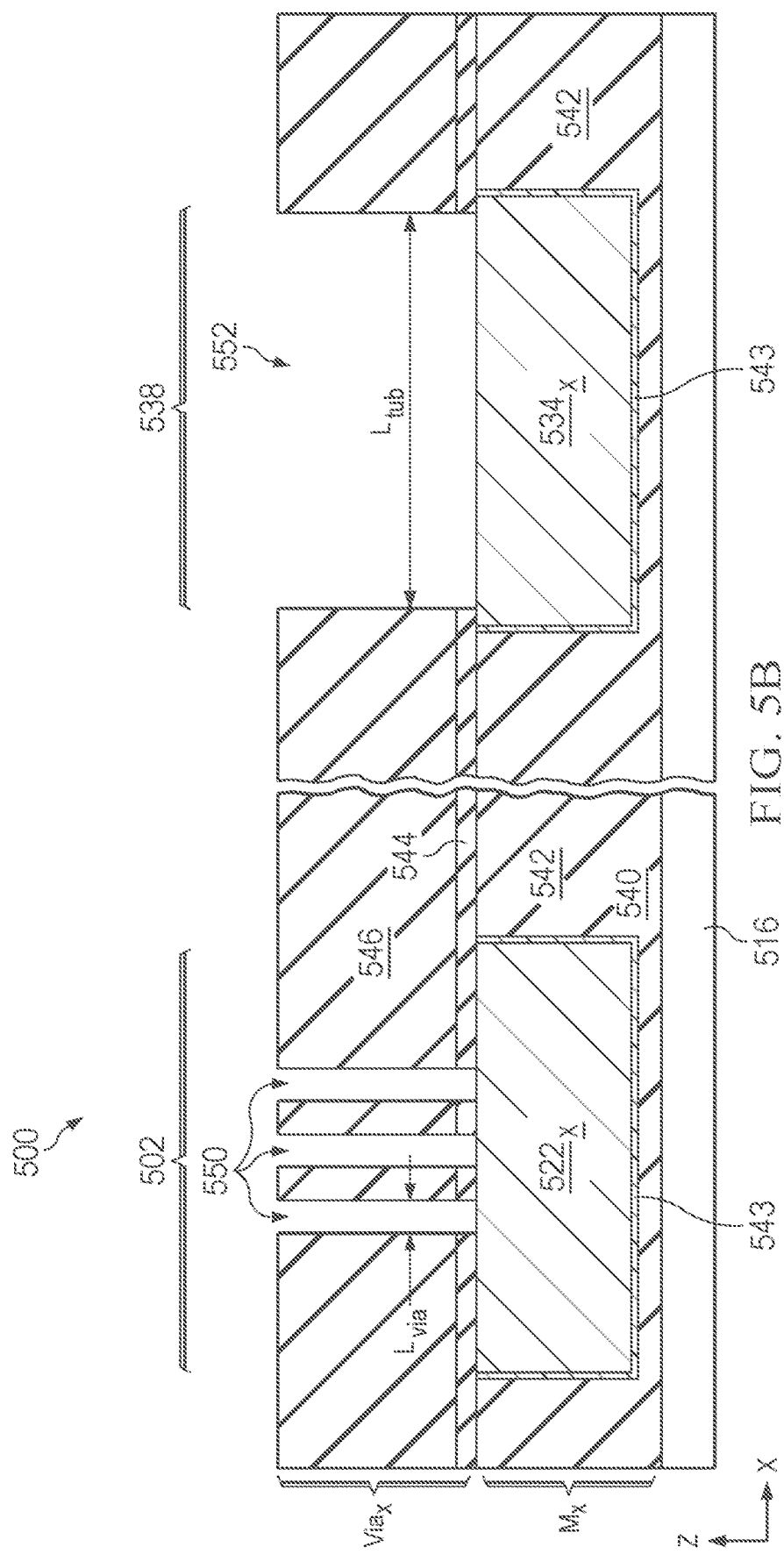
Figure 5C:
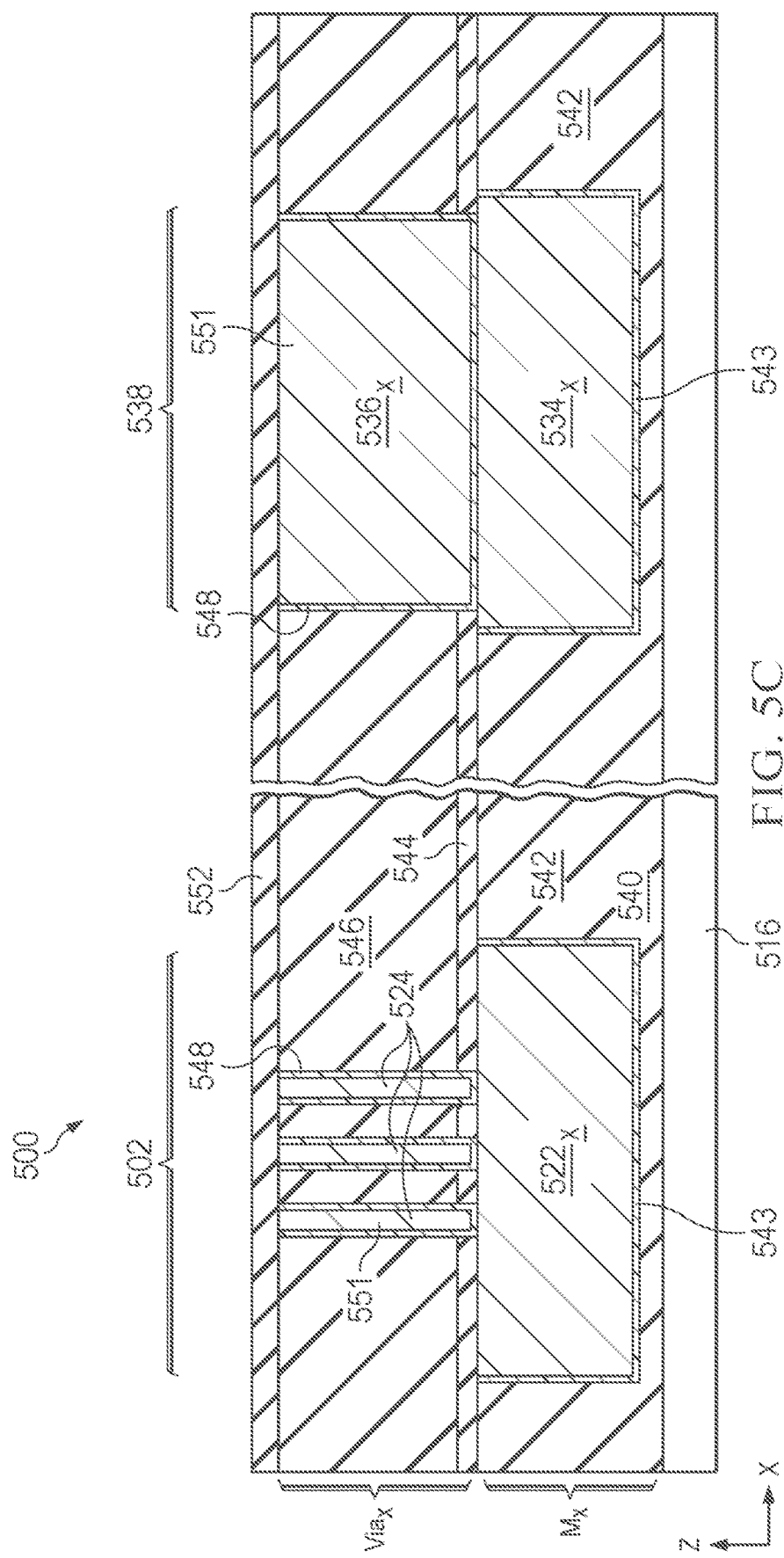

Next, as shown in FIGS. 5B and 5C, interconnect vias 524 and a via layer inductor element $536_x$ are concurrently formed in a via layer $Via_x$ using a single damascene process. First, as shown in FIG. 5B, the IMD region 546 is patterned and etched (e.g., using a plasma etch) to concurrently form interconnect via openings 550 exposing top surface areas of the metal layer interconnect element $522_x$ and a tub opening 552 exposing a top surface area of the metal layer inductor element $534_x$. The interconnect via openings 550 may be formed as narrow via openings with a length $L_{via}$ in both the x-direction and y-direction of less than 0.5 μm, e.g., between 0.1 and 0.5 μm. In contrast, the tub opening 552 may have a substantially larger x-direction length ($L_{tub}$) and y-direction with (not shown) than each interconnect via opening 550. For example, the tub opening 552 may have an x-direction length $L_{tub}$ and a y-direction length (not shown) of at least 1 μm, at least 2 μm, at least 5 μm, at least 10 μm, or at least 100 μm, depending on the particular implementation.

Next, as shown in FIG. 5C, a barrier layer 548, e.g., comprising a TaN/Ta bilayer, is deposited in the interconnect via openings 550 and tub opening 552. A metal 551 (e.g., copper) is then deposited over the barrier layer 548 to fill the via openings 550 and tub opening 552. An anneal may be performed to anneal the deposited metal. A chemical mechanical planarization (CMP) process may be performed to remove portions of the metal 551 outside the interconnect via openings 550 and tub opening 552. The remaining metal 551 in the interconnect via openings 550 defines the interconnect vias 524, and the remaining copper in the tub opening 552 defines the via layer inductor element $536_x$. A dielectric barrier layer 552, e.g., comprising SiN or SiC, may be deposited over the via layer $Via_x$.

Figure 5D:
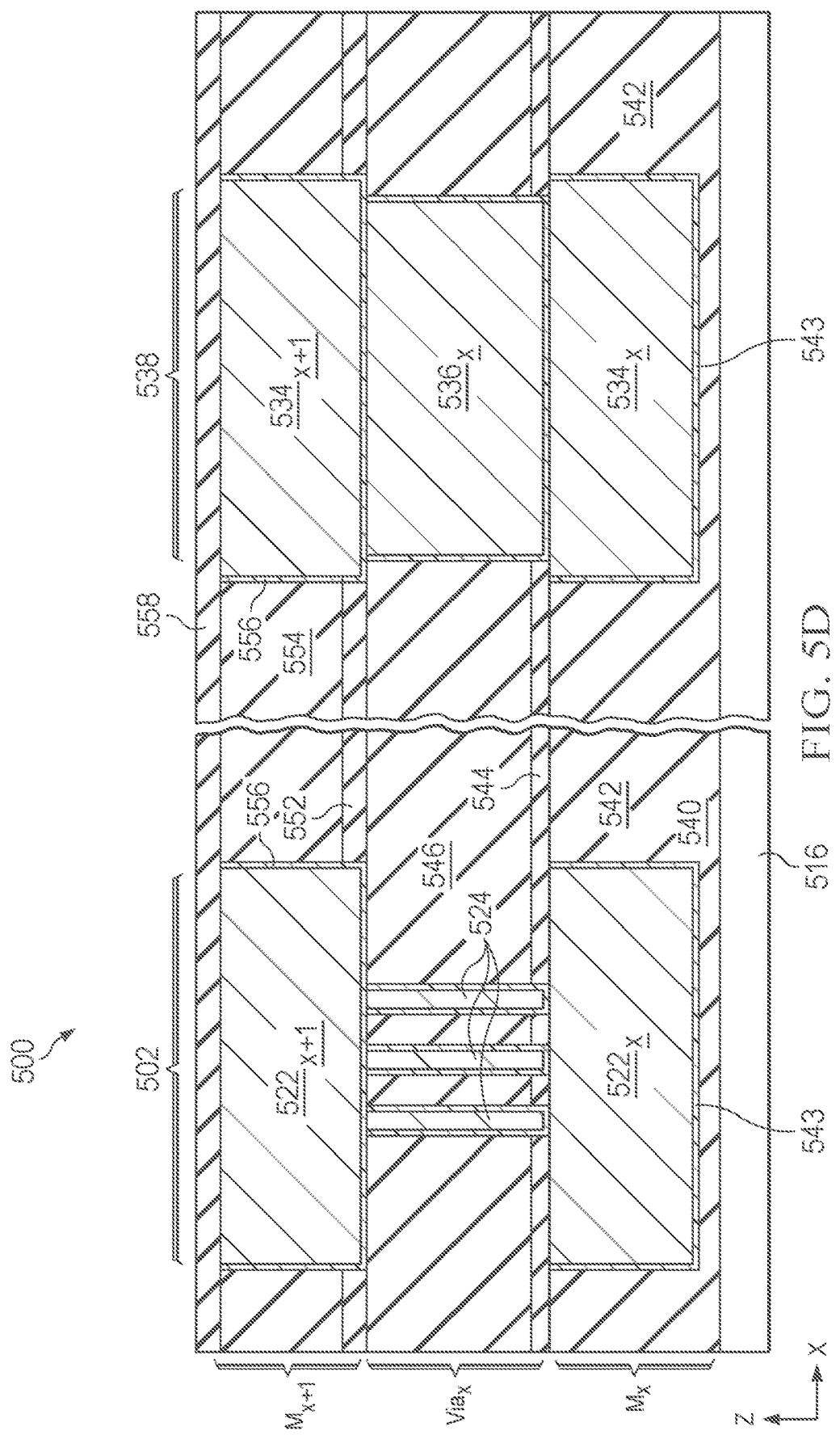

Next, as shown in FIG. 5D, the next metal interconnect layer $M_{x+1}$ may then be formed, including a metal layer interconnect element $522_{x+1}$ and a metal layer inductor element $534_{x+1}$, which may be formed concurrently in a dielectric layer 554, e.g., using a known damascene process. The metal layer inductor element $534_{x+1}$ may have a length of at least 1 μm, at least 2 μm, at least 5 μm, at least 10 μm, or at least 100 μm, in the x-direction and/or the y-direction, depending on the particular implementation. The metal layer interconnect element $522_{x+1}$ and a metal layer inductor element $534_{x+1}$ may be formed from copper or other conductive material. The metal layer interconnect element $522_{x+1}$ and metal layer inductor element $534_{x+1}$ may each be formed over a barrier layer 556, e.g., comprising a TaN/Ta bilayer. A dielectric barrier layer 558, e.g., comprising SiN or SiC, may be deposited over the metal interconnect layer $M_{x+1}$.

This process may be repeated to form additional via layer inductor elements and metal layer inductor elements in additional via layers and metal interconnect layers, respectively, to form a desired vertical thickness (z-direction) of the inductor element stack 538.

FIGS. 6A-6D show a series of side cross-sectional views of an example IC device 600 showing an example process for constructing an inductor element stack 638 extending both vertically and laterally (e.g., for construction of the example integrated inductor 202 discussed above), concurrently with construction of a typical interconnect structure 602. The example process involves damascene process steps, as discussed below.

First, as shown in FIG. 6A, a metal interconnect layer $M_x$ is constructed over a substrate 616, e.g., silicon substrate. IC device 600 may include any number of intervening layers or structures 640 (including transistors and/or other IC elements) between the substrate 616 and the metal interconnect layer $M_x$, in the vertical direction (z-direction). Metal interconnect layer $M_x$ may include a metal layer interconnect element $622_x$ and a metal layer inductor element $634_x$, which may be formed concurrently in a dielectric layer 642, e.g., using a known damascene process. The metal layer inductor element $634_x$ may have a length $L_{634x}$ of at least 1 μm, at least 2 μm, at least 5 μm, at least 10 μm, or at least 100 μm, in the x-direction and/or the y-direction, depending on the particular implementation. The metal layer interconnect element $622_x$ and a metal layer inductor element $634_x$ may be formed from copper or other conductive material. In some examples, the metal layer interconnect element $622_x$ and metal layer inductor element $634_x$ may each be formed over a barrier layer 643, e.g., comprising a TaN/Ta bilayer.

A dielectric barrier layer 644, e.g., comprising SiN or SiC may be deposited on the metal interconnect layer $M_x$, followed by deposition of an IMD layer 646, e.g., comprising silicon oxide $SiO_2$, FSG, OSG, or porous OSG.

Figure 6B:
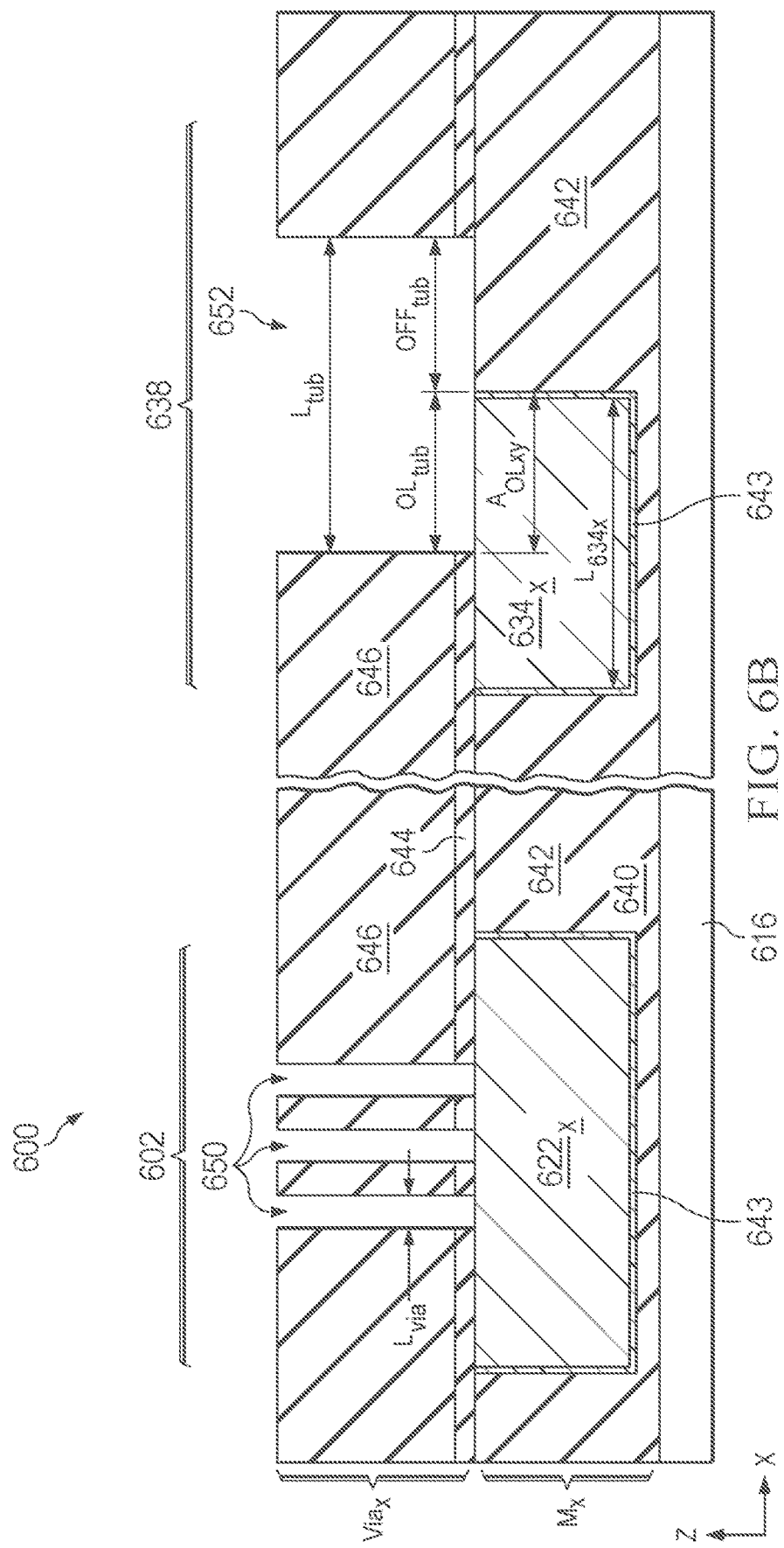
Figure 6C:
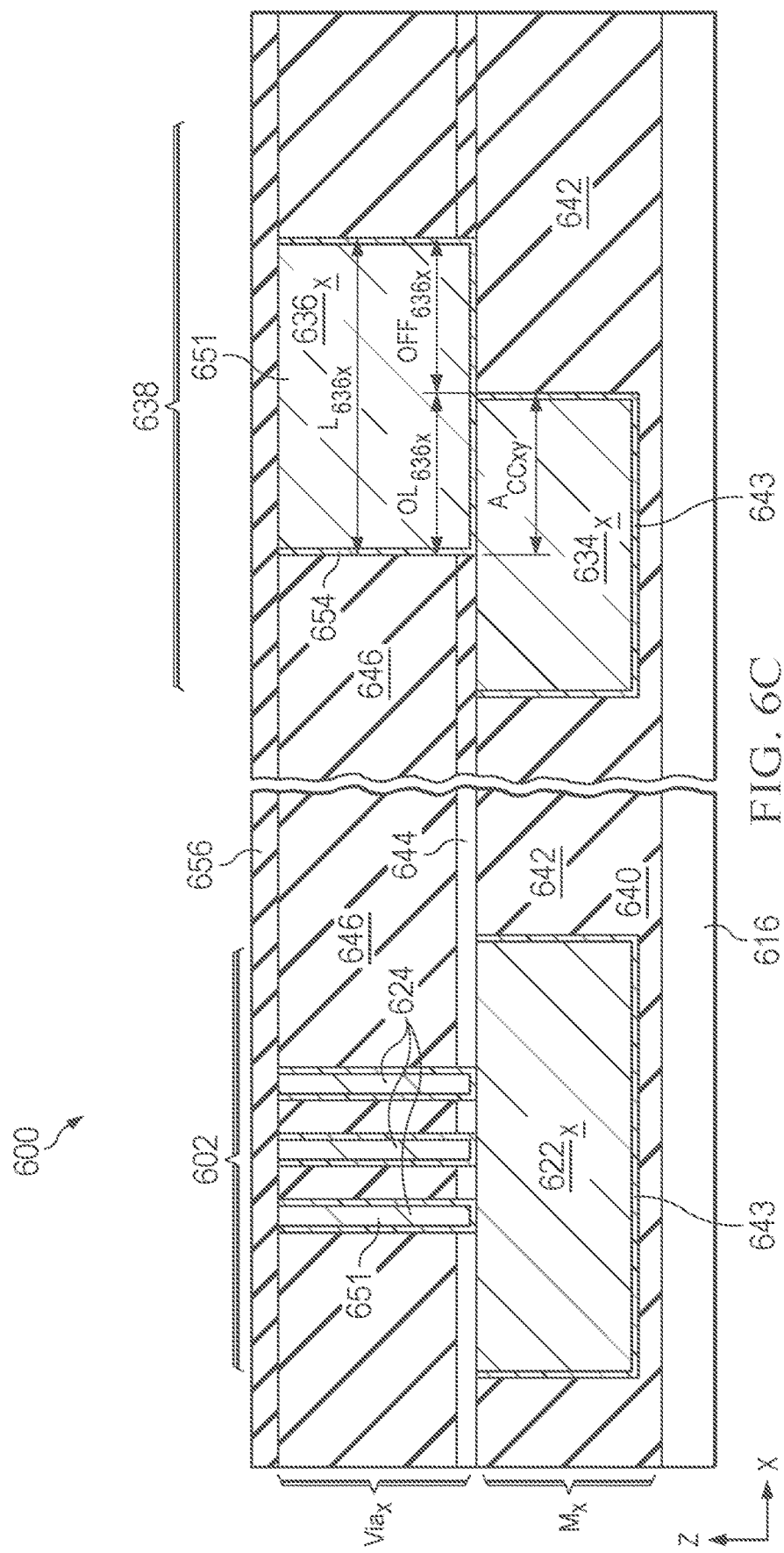

Next, as shown in FIGS. 6B and 6C, interconnect vias 624 and a laterally-offset via layer inductor element 636x are concurrently formed in a via layer $Via_x$ using a single damascene process. First, as shown in FIG. 6B, the IMD region 646 is patterned and etched (e.g., using a plasma etch) to concurrently form interconnect via openings 650 exposing top surface areas of the metal layer interconnect element $622_x$ and a tub opening 652 exposing a top surface area of the metal layer inductor element $634_x$. The interconnect via openings 650 may be formed as narrow via openings with a length $L_{via}$ in both the x-direction and y-direction of less than 0.5 μm, e.g., between 0.1 and 0.5 μm. In contrast, the tub opening 652 may have a substantially larger x-direction length ($L_{tub}$) and/or y-direction length (not shown) than each interconnect via opening 650. For example, the tub opening 652 may have an x-direction length $L_{tub}$ and a y-direction length (not shown) of at least 1 µm, at least 2 µm, at least 5 µm, at least 10 µm, or at least 100 µm, depending on the particular implementation.

In some examples, the x-direction length $L_{tub}$ and/or y-direction length of tub opening 652 may be the same or similar to (e.g., less than 10% different than) the x-direction length $L_{634x}$ and/or y-direction length, respectively, of the underlying metal layer inductor element $634_x$. In other examples, the x-direction length $L_{tub}$ and/or y-direction length of tub opening 652 may be different (e.g., at least 10% different than) the x-direction length $L_{634x}$ and/or y-direction length, respectively, of the underlying metal layer inductor element $634_x$.

Moreover, as shown in FIG. 6B, the etched tub opening 652 is formed laterally offset from the underlying metal layer inductor element $634_x$, e.g., as discussed above with respect to inductor elements 233 of example integrated inductor 202 discussed above regarding FIGS. 2A-2B. As shown, tub opening 652 overlaps underlying metal layer inductor element $634_x$ in the x-direction by an overlap distance $OL_{tub}$, and extends laterally beyond underlying metal layer inductor element $634_x$ in the x-direction by an offset distance $OFF_{tub}$. In some examples, (a) overlap distance $OL_{tub}$ is in the range of 10-90%, e.g., in the range of 25%-75%, of the length $L_{634x}$ of underlying metal layer inductor element $634_x$, and (b) offset distance $OFF_{tub}$ is in the range of 10-90%, e.g., in the range of 25%-75%, of the length $L_{634x}$ of underlying metal layer inductor element $634_x$. The overlap distance $OL_{tub}$ and offset distance $OFF_{tub}$ define an overlap distance $OL_{636x}$ and offset distance $OFF_{636x}$ respectively between a subsequently formed via layer inductor element $636_x$ (formed in the tub opening 652) and underlying metal layer inductor element $634_x$, as shown in FIG. 6C.

In addition, tub opening 652 may laterally align with the underlying metal layer inductor element $634_x$ in the y-direction. Alternatively, tub opening 652 may be formed offset from the underlying metal layer inductor element $634_x$ in the y-direction, with an overlap distance and offset distance in the y-direction in the range of 10-90%, e.g., in the range of 25%-75%. Thus, in some examples, tub opening 652 may be formed offset from the underlying metal layer inductor element $634_x$ in both the x-direction and the y-direction.

In some examples, the overlap distance between tub opening 652 and underlying metal layer inductor element $634_x$ in the x-direction and y-direction define an overlap area in the x-y plane, indicated as $A_{OLxy}$, of at least 1 µm², at least 5 µm², at least 20 µm², or at least 100 µm², depending on the particular implementation. This overlap area $A_{OLxy}$ defines an area of conductive contact $A_{CCxy}$ between a subsequently formed via layer inductor element $636_x$ (in the tub opening 652) and underlying metal layer inductor element $634_x$, as shown in FIG. 6C.

Next, as shown in FIG. 6C, a barrier layer 654, e.g., comprising a TaN/Ta bilayer, is deposited in the interconnect via openings 650 and tub opening 652. A metal 651 (e.g., copper) is then deposited over the barrier layer 654 to fill the via openings 650 and tub opening 652. An anneal may be performed to anneal the deposited metal 651. A CMP process may be performed to remove portions of the metal 651 outside (above) the interconnect via openings 650 and tub opening 652. The remaining metal 651 (e.g., copper) in the interconnect via openings 650 defines the interconnect vias 624, and the remaining metal 651 (e.g., copper) in the tub opening 652 defines the via layer inductor element $636_x$. A dielectric barrier layer 656, e.g., comprising SiN or SiC, may be deposited over the via layer $Via_x$.

As shown, via layer inductor element $636_x$ has an x-direction length $L_{636x}$, and the via layer inductor element $636_x$ overlaps underlying metal layer inductor element $634_x$ in the x-direction by an overlap distance $OL_{636x}$, and extends laterally beyond underlying metal layer inductor element $634_x$ in the x-direction by an offset distance $OFF_{636x}$. The length $L_{636}$, overlap distance $OL_{636x}$, and offset distance $OFF_{636x}$ of via layer inductor element $636_x$ are defined by the length $L_{tub}$, overlap distance $OL_{tub}$, and offset distance $OFF_{tub}$, respectively, of tub opening 652, as discussed above.

Figure 6D:
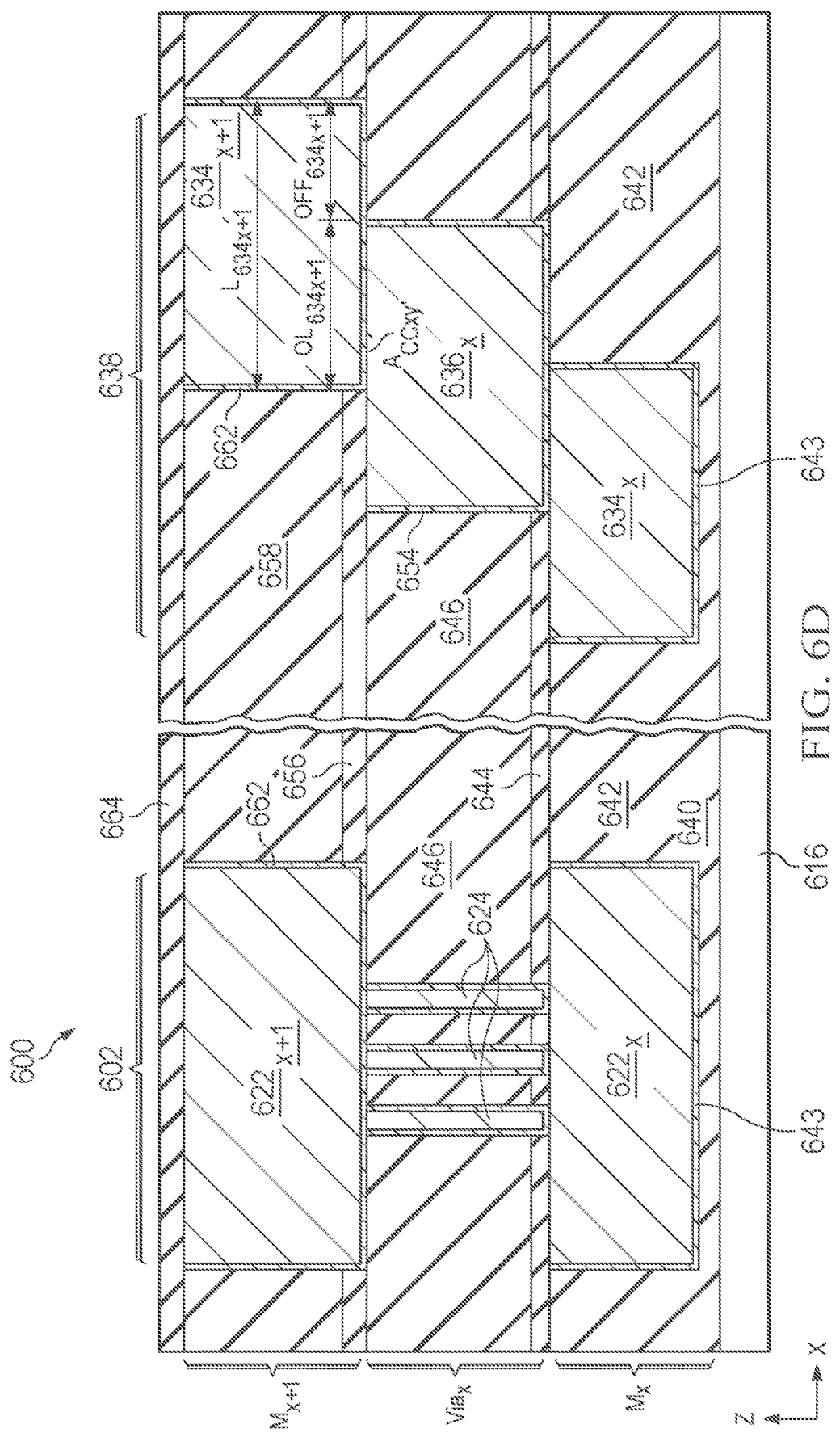

Next, as shown in FIG. 6D, the next metal interconnect layer $M_{x+1}$ may then be formed, including a metal layer interconnect element $622_{x+1}$ and a metal layer inductor element $634_{x+1}$, which may be formed concurrently in a dielectric layer 658, e.g., using a known damascene process. The metal layer interconnect element $622_{x+1}$ and a metal layer inductor element $634_{x+1}$ may be formed from copper or other conductive material. The metal layer interconnect element $622_{x+1}$ and metal layer inductor element $634_{x+1}$ may each be formed over a barrier layer 662, e.g., comprising a TaN/Ta bilayer. A dielectric barrier layer 664, e.g., comprising SiN or SiC, may be deposited over the metal interconnect layer $M_{x+1}$.

As shown, the metal layer inductor element $634_{x+1}$ may have a length $L_{634x+1}$, of at least 1 µm, at least 2 µm, at least 5 µm, at least 10 µm, or at least 100 µm, in the x-direction and/or the y-direction, depending on the particular implementation. In addition, metal layer inductor element $634_{x+1}$ may overlap underlying via layer inductor element $636_x$ in the x-direction by an overlap distance $OL_{634x+1}$, and extend laterally beyond underlying metal layer inductor element $634_x$ in the x-direction by an offset distance $OFF_{634x+1}$. The overlap distance $OL_{634x+1}$ and a corresponding overlap in the y-direction may define an area of conductive contact $A_{CCxy}'$ between metal layer inductor element $634_{x+1}$ and underlying via layer inductor element $636_x$. In some examples, the length $L_{634x+1}$, overlap distance $OL_{634x+1}$, and offset distance $OFF_{634x+1}$ of via layer inductor element $634_{x+1}$ may correspond with the length $L_{636x}$, overlap distance $OL_{636x}$, and offset distance $OFF_{636x}$, respectively, of via layer inductor element $636_x$. The area of conductive contact $A_{CCxy}'$ between metal layer inductor element $634_{x+1}$ and underlying via layer inductor element $636_x$ may correspond with the area of conductive contact $A_{CCxy}$ between via layer inductor element $636_x$ and underlying metal layer inductor element $634_x$ (shown in FIG. 6C).

This process may be repeated to form additional via layer inductor elements and metal layer inductor elements in additional via layers and metal interconnect layers, respectively, to form a desired vertical height (z-direction) of the inductor element stack 638.

FIGS. 7A-7G show a series of side cross-sectional views of an example IC device 700 showing another example process for constructing a vertically-extending inductor element stack 738 (e.g., for construction of the example integrated inductor 102, 302, or 302 discussed above) concurrently with construction of a typical interconnect structure 702. The example process of FIGS. 7A-7G involves a dual damascene process, and represents an alternative to the example process shown in FIGS. 5A-5D.

Figure 7A:
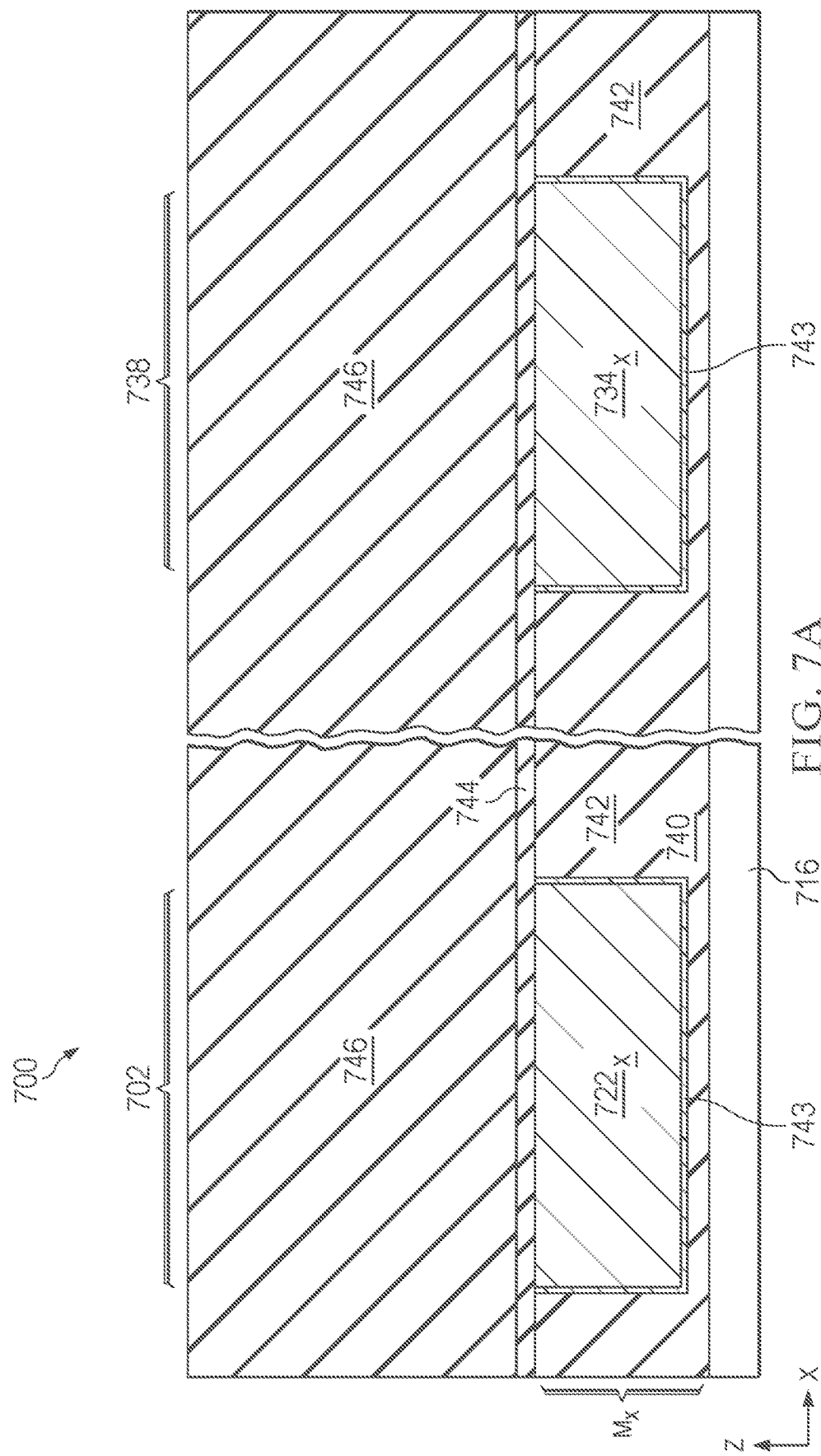
FIGS. 7A-7G show an example process for constructing a vertically-extending inductor element stack concurrently with a typical interconnect structure, using a dual damascene process.

First, as shown in FIG. 7A, a metal interconnect layer $M_x$ is constructed over a substrate 716, e.g., silicon substrate. IC device 700 may include any number of intervening layers or structures 740 (including transistors and/or other IC elements) between the substrate 716 and the metal interconnect layer $M_x$, in the vertical direction (z-direction). Metal interconnect layer $M_x$ may include a metal layer interconnect element $722_x$ and a metal layer inductor element $734_x$, which may be formed concurrently in a dielectric layer 742, e.g., using a known damascene process. The metal layer inductor element $734_x$ may have a length of at least 1 µm, at least 2 µm, at least 5 µm, at least 10 µm, or at least 100 µm, in the x-direction and/or the y-direction, depending on the particular implementation. The metal layer interconnect element $722_x$ and a metal layer inductor element $734_x$ may be formed from copper or other conductive material. In some examples, the metal layer interconnect element $722_x$ and metal layer inductor element $734_x$ may each be formed over a barrier layer 743, e.g., comprising a TaN/Ta bilayer.

A dielectric barrier layer 744, e.g., comprising SiN or SiC may be deposited on the metal interconnect layer $M_x$, followed by deposition of a thick IMD layer 746, e.g., comprising $SiO_2$, FSG, OSG, or porous OSG.

Next, as shown in FIGS. 7B-7G, a dual damascene process is performed to concurrently form (a) interconnect vias 724 and a via layer inductor element $736_x$ in a via layer $Via_x$ and (b) a metal layer interconnect element $722_{x+1}$ and metal layer inductor element $734_{x+1}$ in a metal interconnect layer $M_{x+1}$.

Figure 7B:
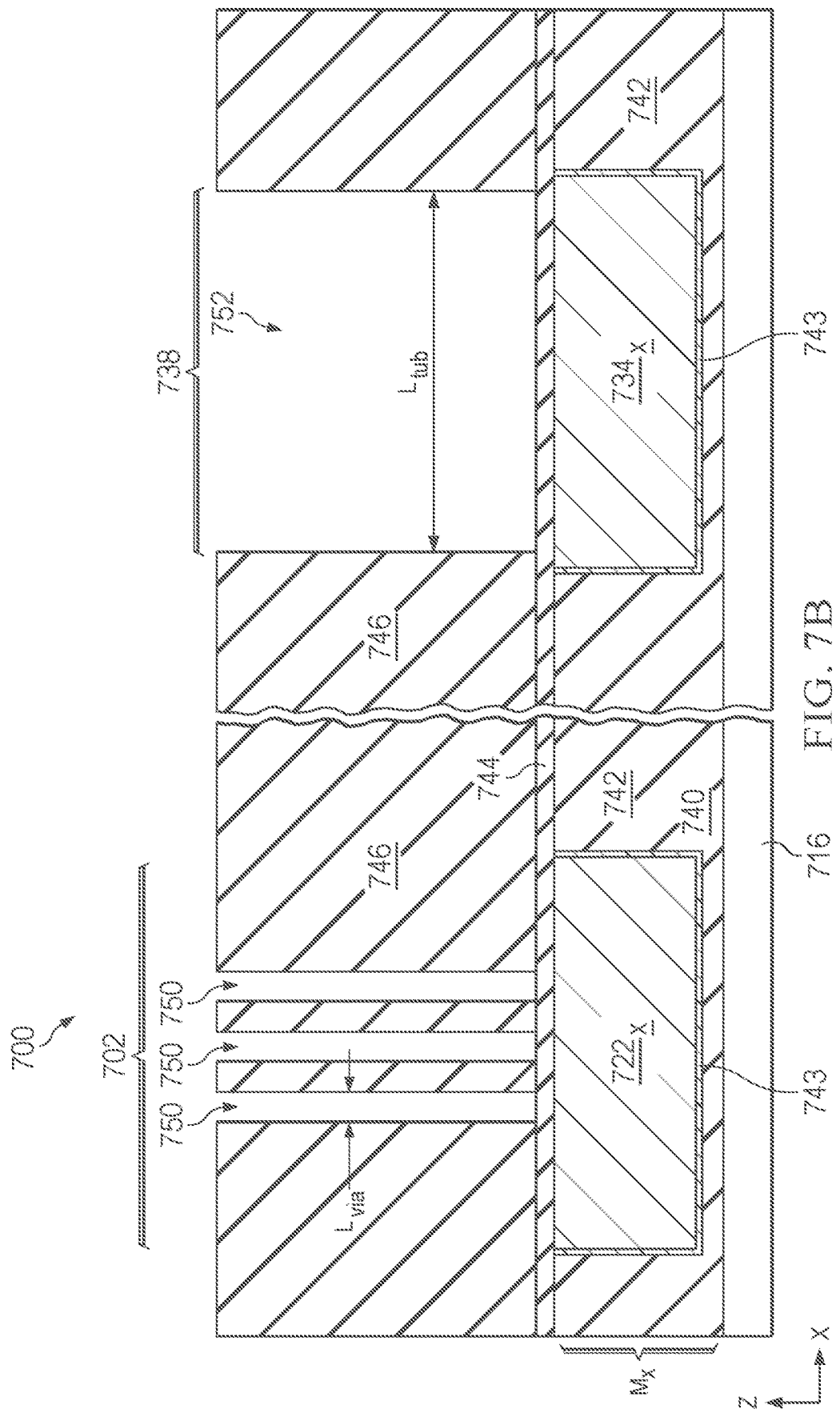

As shown in FIG. 7B, the thick IMD region 746 is patterned and etched (e.g., using a plasma etch) to concurrently form deep via openings 750, and a deep tub opening 752, wherein the etch stops on the dielectric barrier layer 744 in each opening 750 and 752. The interconnect via openings 750 may be formed as narrow via openings with a length $L_{via}$ in both the x-direction and y-direction of less than 0.5 µm, e.g., between 0.1 and 0.5 µm. In contrast, the tub opening 752 may have a substantially larger x-direction length ($L_{tub}$) and y-direction length (not shown) than each interconnect via opening 750. For example, the tub opening 752 may have an x-direction length $L_{tub}$ and a y-direction length (not shown) of at least 1 µm, at least 2 µm, at least 5 µm, at least 10 µm, or at least 100 µm, depending on the particular implementation.

Figure 7C:
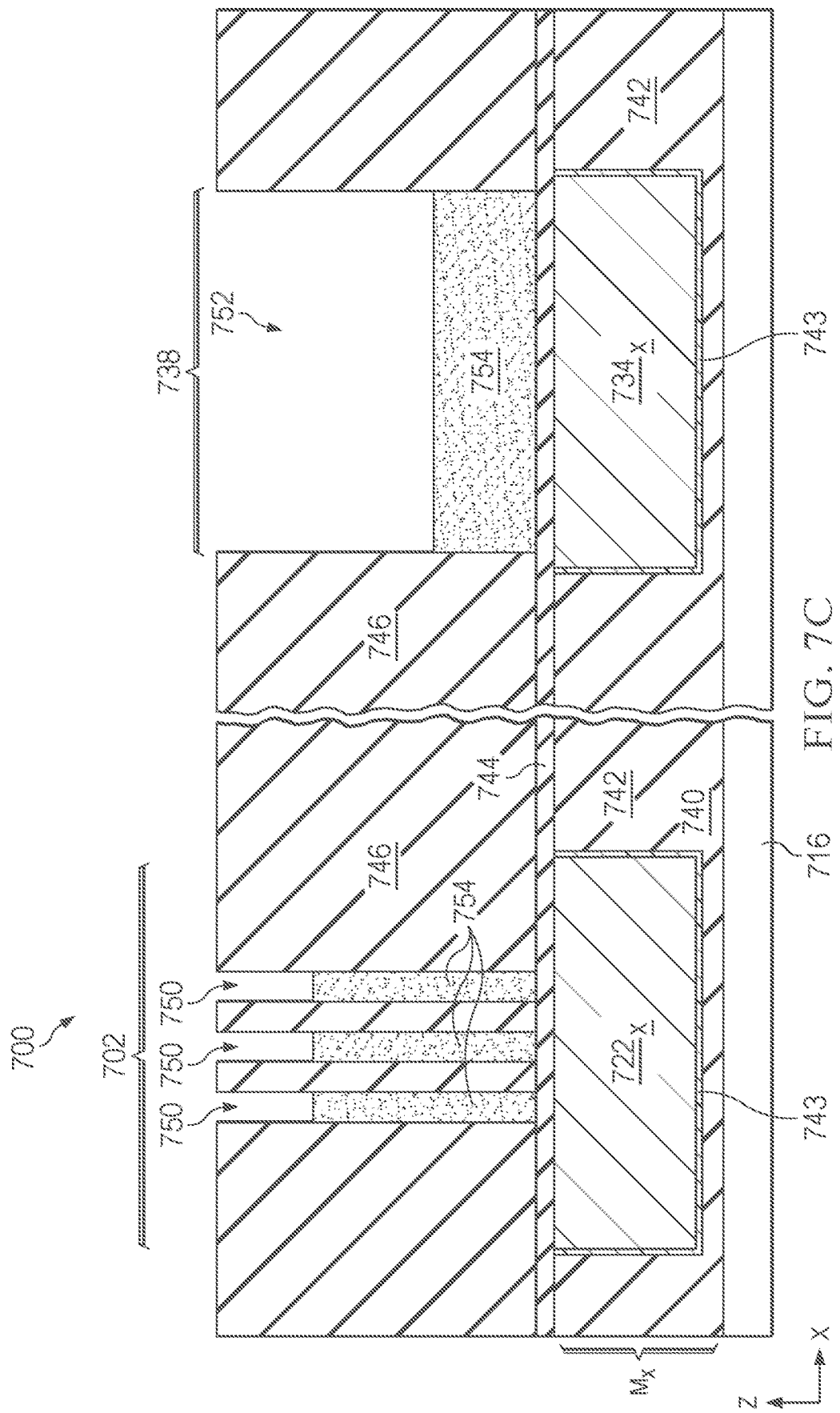

Next, as shown in FIG. 7C, a sacrificial material 754 is deposited over the structure and at least partially filling the deep via openings 750 and deep tub opening 752, to protect the underlying metal layer interconnect element $722_x$ and metal layer inductor element $734_x$ (e.g., formed from copper) during a subsequent etch discussed below with reference to FIG. 7D. In some embodiments the sacrificial material 754 may comprise organic bottom anti-reflective coating (BARC) or DUOTM248 anti-reflective coating (e.g., DU0248.3NA 1.4 cP Spin-On Glass) from Honeywell International Inc.

Figure 7D:
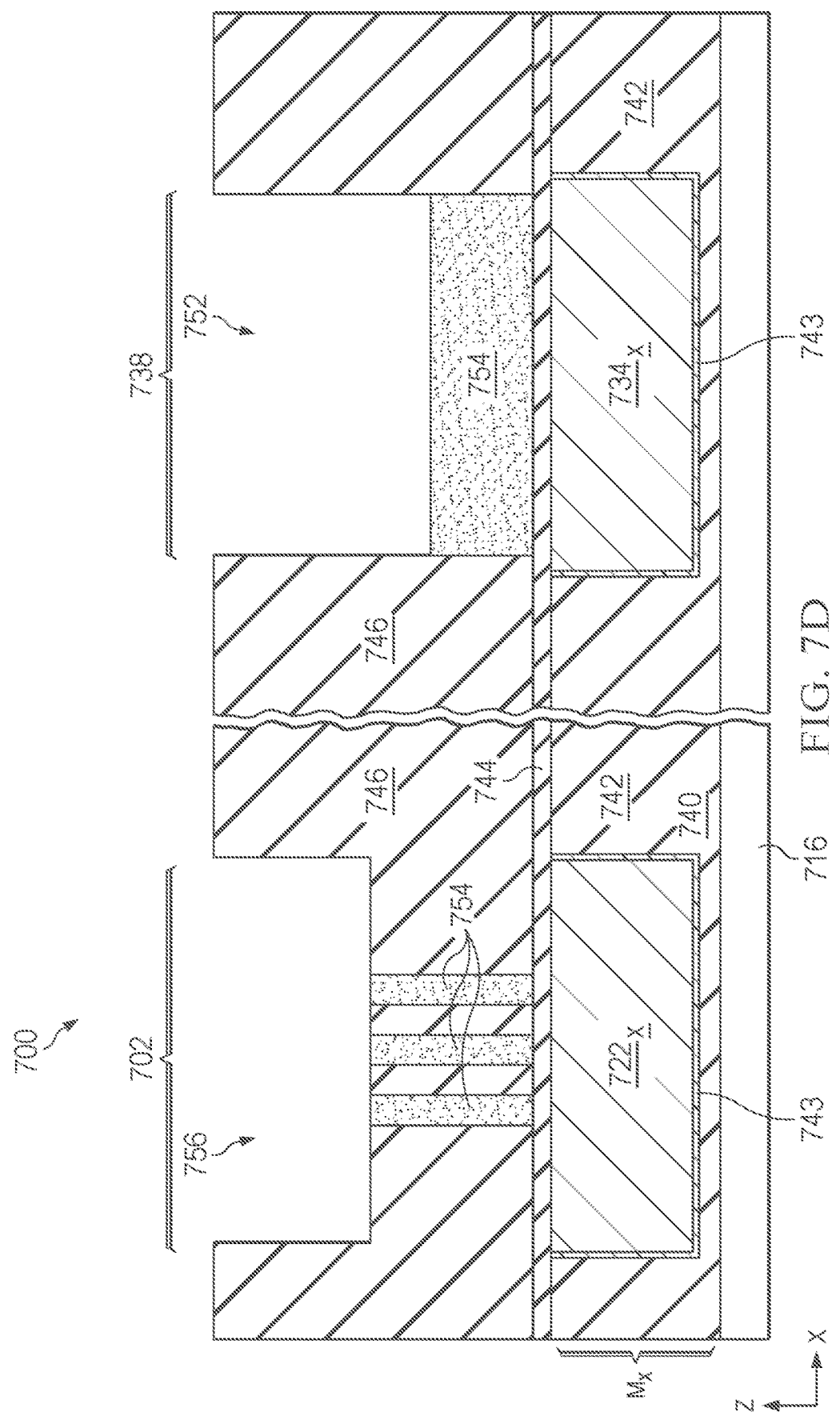

Next, as shown in FIG. 7D, a trench opening 756 is patterned and etched over the metal layer interconnect element $722_x$, wherein the sacrificial material 754 in the deep via openings 750 protects the metal layer interconnect element $722_x$ (e.g., comprising copper) from the trench etch.

Figure 7E:
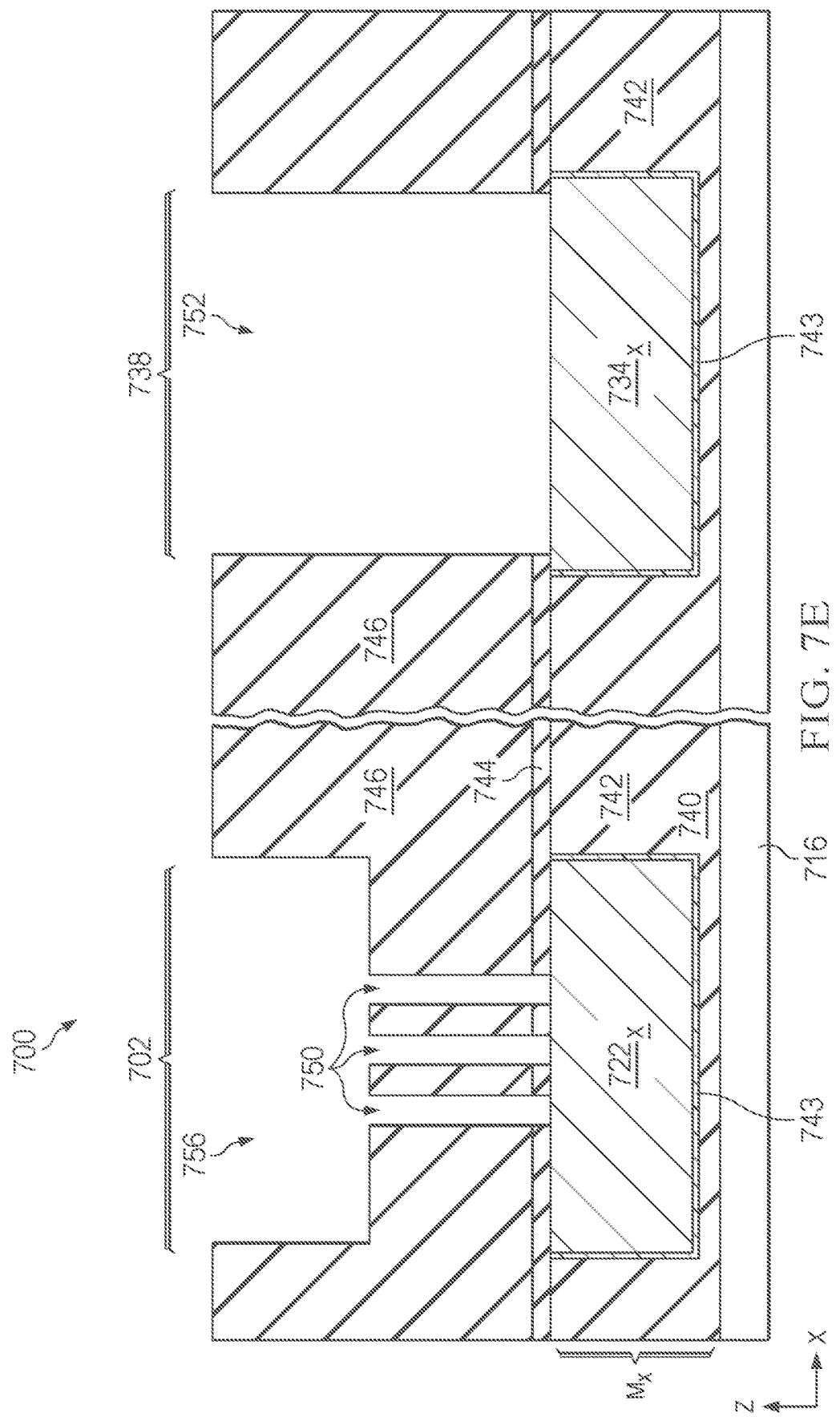

Next, as shown in FIG. 7E, the sacrificial material 754, along with remaining dielectric barrier layer 744 in deep via openings 750 and deep tub opening 752 are removed. In some examples sacrificial material 754 may be removed using an ash process, and dielectric barrier layer 744 may be removed using a nitride etch or other suitable etch.

Figure 7F:
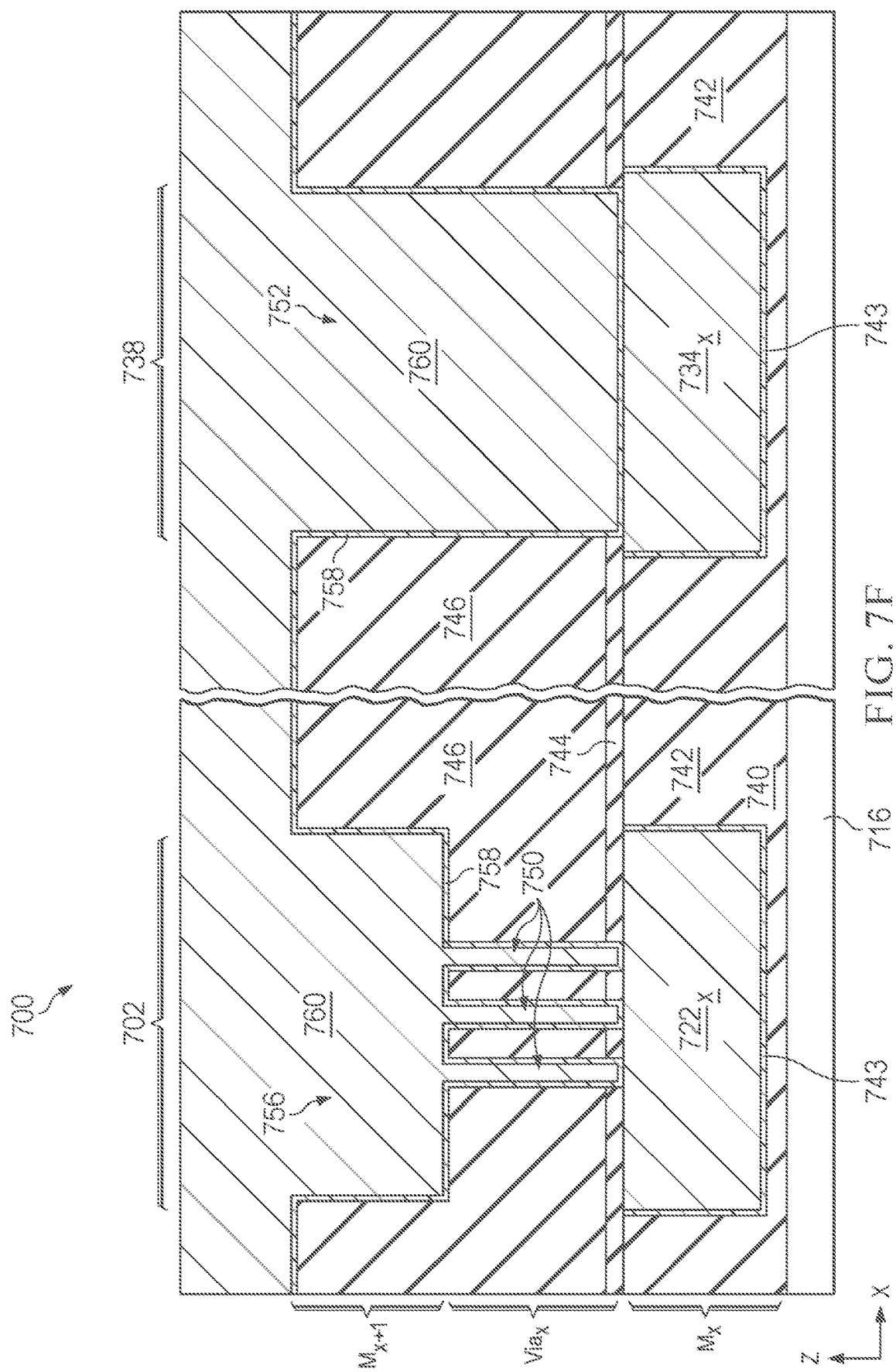

Next, as shown in FIG. 7F, a barrier layer 758, e.g., comprising a TaN/Ta bilayer, is then deposited over the structure and into the trench opening 756, via openings 750, and deep tub opening 752. A metal 760 (e.g., copper) is then deposited over the barrier layer 758 to fill the trench opening 756, via openings 750, and deep tub opening 752. An anneal may be performed to anneal the deposited metal 760.

Figure 7G:
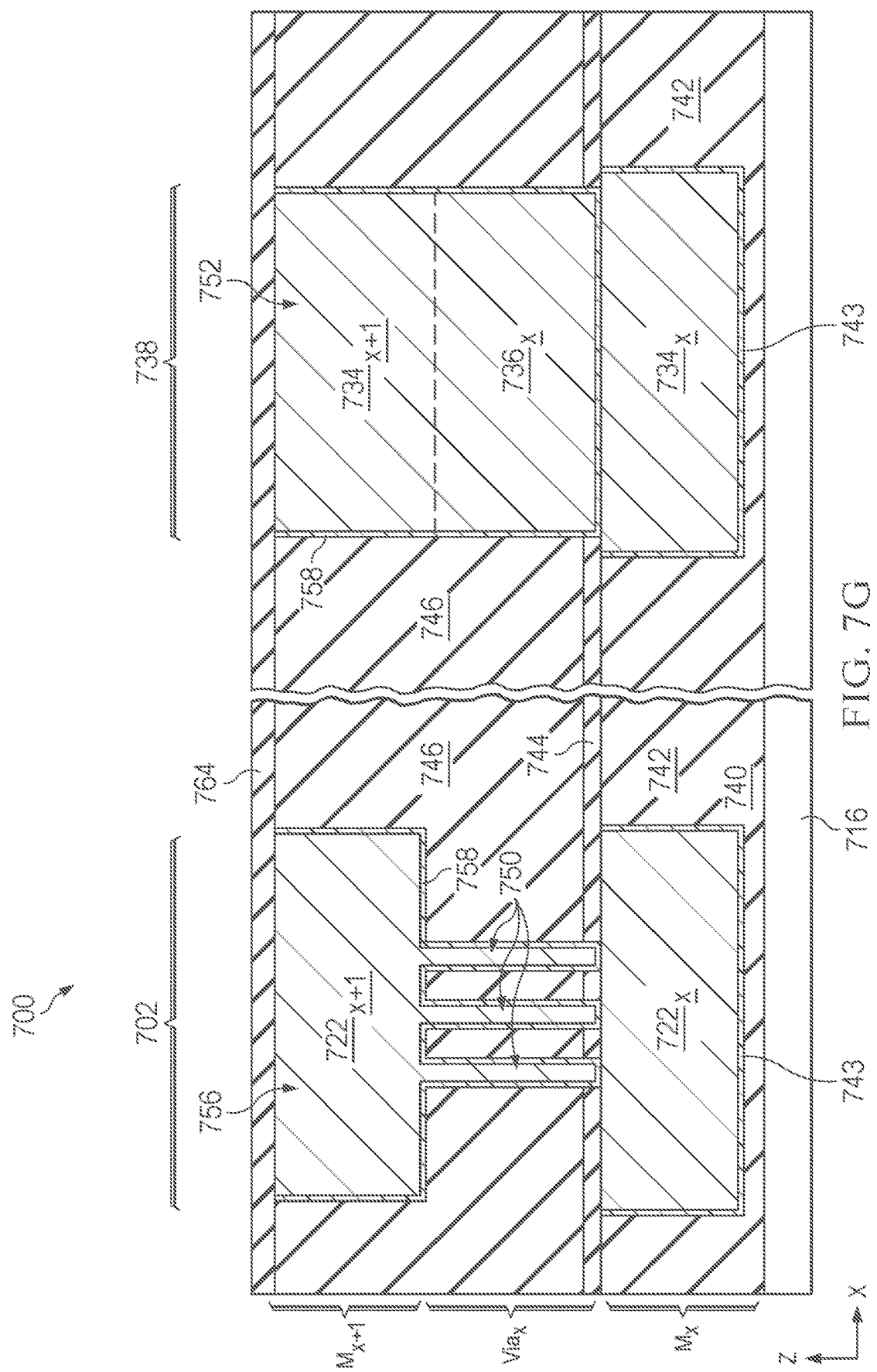

As shown in FIG. 7G, a CMP process may be performed to remove portions of the metal 760 (e.g., copper) outside (above) the interconnect trench opening 756 and tub opening 752, and a dielectric barrier layer 764, e.g., comprising SiN or SiC, may be deposited over the structure. Remaining metal 760 in the interconnect via openings 750 defines interconnect vias 724 in a via layer $Via_x$; remaining metal 760 in the trench opening 756 defines a metal layer interconnect element $722_{x+1}$ in a metal interconnect layer $M_{x+1}$; and remaining metal 760 in the deep tub opening 752 defines a via layer inductor element $736_x$ in the via layer $Via_x$ and a metal layer inductor element $734_{x+1}$ in the metal layer interconnect element $722_{x+1}$.

FIG. 8A-8G show a series of side cross-sectional views of an example IC device 800 showing another example process for constructing an inductor element stack 838 extending both vertically and laterally (e.g., for construction of the example integrated inductor 202 discussed above), concurrently with construction of a typical interconnect structure 802. The example process of FIG. 8A-8G involves a dual damascene process, and represents an alternative to the example process shown in FIGS. 6A-6D.

Figure 8A:
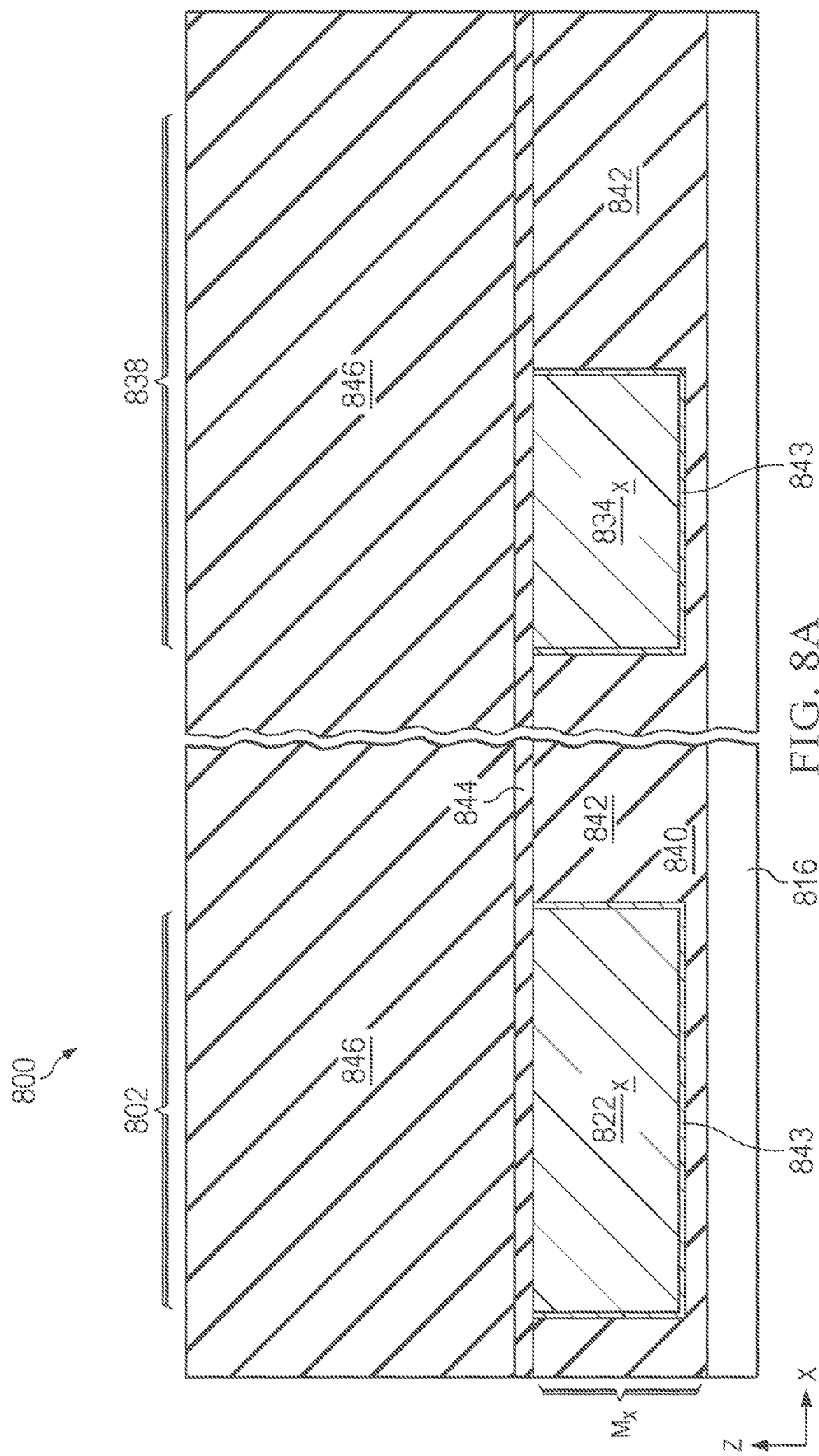
FIG. 8A-8G show an example process for constructing a vertically- and laterally-extending inductor element stack concurrently with a typical interconnect structure, using a dual damascene process.

First, as shown in FIG. 8A, a metal interconnect layer $M_x$ is constructed over a substrate 816, e.g., silicon substrate. IC device 800 may include any number of intervening layers or structures 840 (including transistors and/or other IC elements) between the substrate 816 and the metal interconnect layer $M_x$, in the vertical direction (z-direction). Metal interconnect layer $M_x$ may include a metal layer interconnect element $822_x$ and a metal layer inductor element $834_x$, which may be formed concurrently in a dielectric layer 842, e.g., using a known damascene process. The metal layer inductor element $834_x$ may have a length of at least 1 µm, at least 2 µm, at least 5 µm, at least 10 µm, or at least 100 µm, in the x-direction and/or the y-direction, depending on the particular implementation. The metal layer interconnect element $822_x$ and a metal layer inductor element $834_x$ may be formed from copper or other conductive material. In some examples, the metal layer interconnect element $822_x$ and metal layer inductor element $834_x$ may each be formed over a barrier layer 843, e.g., comprising a TaN/Ta bilayer.

A dielectric barrier layer 844, e.g., comprising SiN or SiC may be deposited on the metal interconnect layer $M_x$, followed by deposition of a thick IMD layer 846, e.g., comprising $SiO_2$, FSG, OSG, or porous OSG.

Next, as shown in FIGS. 8B-8G, a dual damascene process is performed to concurrently form (a) interconnect vias 824 and a via layer inductor element $836_x$ in a via layer $Via_x$ and (b) a metal layer interconnect element $822_{x+1}$ and metal layer inductor element $834_{x+1}$ in a metal interconnect layer $M_{x+1}$.

Figure 8B:
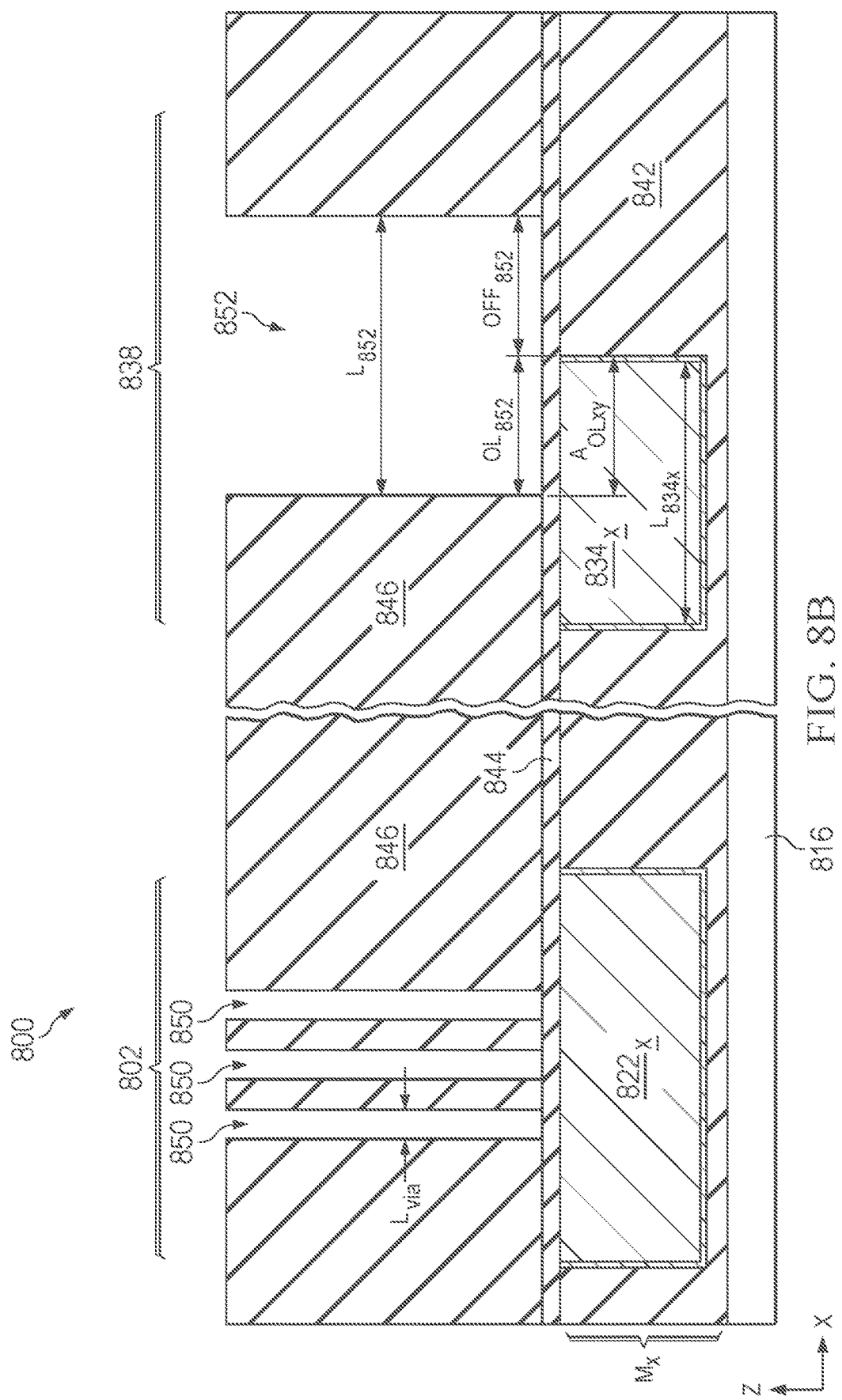

As shown in FIG. 8B, the thick IMD region 846 is patterned and etched (e.g., using a plasma etch) to concurrently form deep via openings 850, and a deep tub opening 852, wherein the etch stops on the dielectric barrier layer 844 in each opening 850 and 852. The interconnect via openings 850 may be formed as narrow via openings with a length $L_{via}$ in both the x-direction and y-direction of less than 0.5 µm, e.g., between 0.1 and 0.5 µm. In contrast, the tub opening 852 may have a substantially larger x-direction length ($L_{952}$) and y-direction with (not shown) than each interconnect via opening 850. For example, the tub opening 852 may have an x-direction length $L_{852}$ and an y-direction length (not shown) of at least 1 µm, at least 2 µm, at least 5 µm, at least 10 µm, or at least 100 µm, depending on the particular implementation.

As shown in FIG. 8B, the deep tub opening 852 is formed laterally offset from the underlying metal layer inductor element $834_x$, e.g., as discussed above with respect to inductor elements 233 of example integrated inductor 202 discussed above regarding FIGS. 2A-2B. As shown, deep tub opening 852 overlaps underlying metal layer inductor element $834_x$ in the x-direction by an overlap distance $OL_{852}$, and extends laterally beyond underlying metal layer inductor element $834_x$ in the x-direction by an offset distance $OFF_{852}$. In some examples, (a) overlap distance $OL_{852}$ is in the range of 10-90%, e.g., in the range of 25%-75%, of the length $L_{834x}$ of underlying metal layer inductor element $834_x$, and (b) offset distance $OFF_{852}$ is in the range of 10-90%, e.g., in the range of 25%-75%, of the length $L_{834x}$ of underlying metal layer inductor element $834_x$.

In addition, tub opening 852 may laterally align with the underlying metal layer inductor element $834_x$ in the y-direction. Alternatively, tub opening 852 may be formed offset from the underlying metal layer inductor element $834_x$ in the y-direction, with an overlap distance and offset distance in the y-direction in the range of 10-90%, e.g., in the range of 25%-75%. Thus, in some examples, tub opening 852 may be formed offset from the underlying metal layer inductor element $834_x$ in both the x-direction and the y-direction.

In some examples, the overlap distance between tub opening 852 and underlying metal layer inductor element $834_x$ in the x-direction and y-direction define an overlap area in the x-y plane, indicated as $A_{OLxy}$, of at least 1 µm², at least 5 µm², at least 20 µm², or at least 100 µm², depending on the particular implementation. This overlap area $A_{OLxy}$ defines an area of conductive contact $A_{CCxy}$ between a subsequently formed via layer inductor element $836_x$ (in the tub opening 852) and underlying metal layer inductor element $834_x$, as shown in FIG. 8F.

Figure 8C:
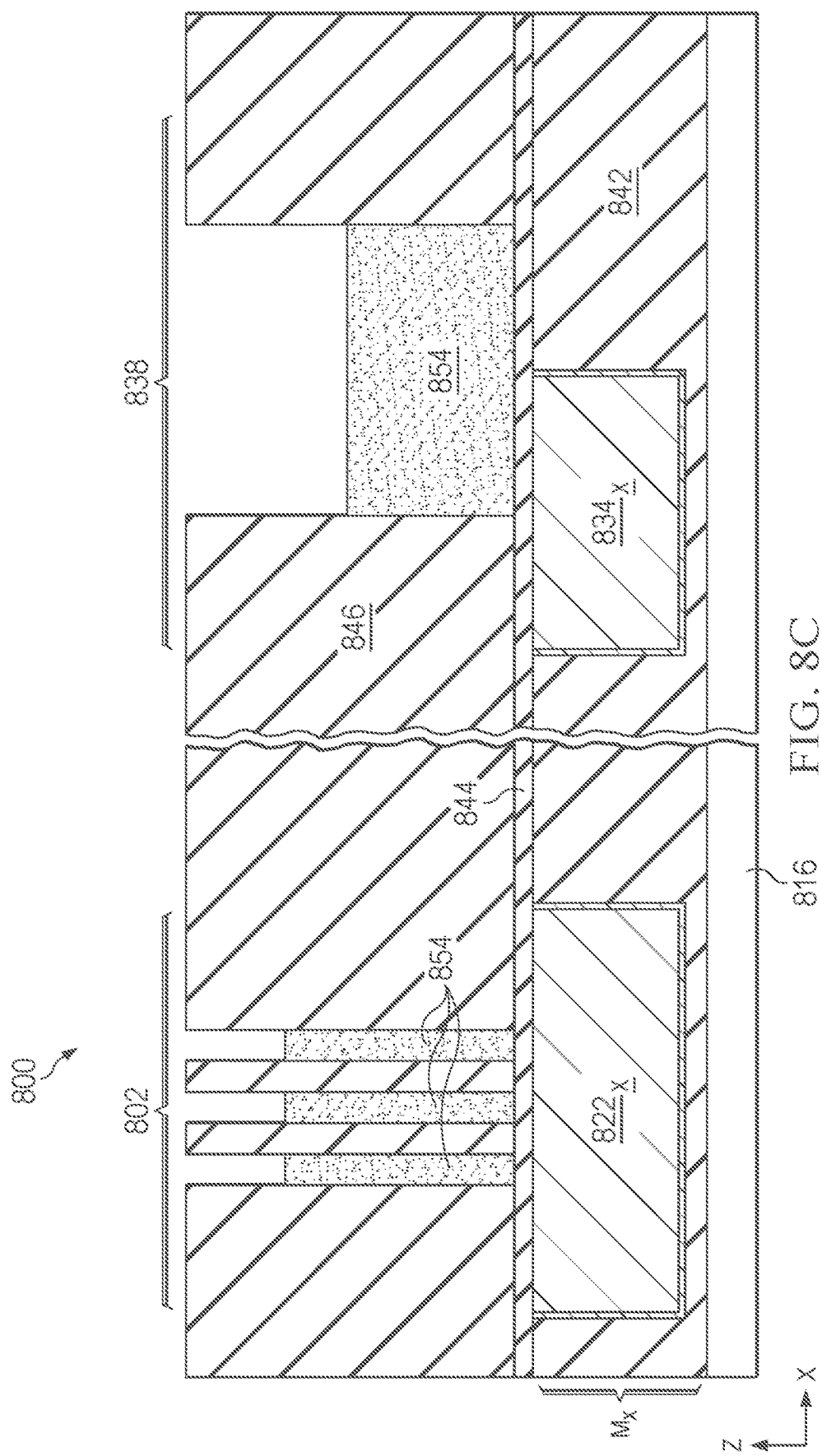

Next, as shown in FIG. 8C, a sacrificial material 854 is deposited over the structure, at least partially filling the deep via openings 850 and deep tub opening 852, to protect the underlying metal layer interconnect element $822_x$ and metal layer inductor element $834_x$ (e.g., formed from copper) during a subsequent etch discussed below with reference to FIG. 8D. In some embodiments the sacrificial material 854 may comprise an organic BARC coating or a DUOTM248 anti-reflective coating from Honeywell International Inc.

Figure 8D:
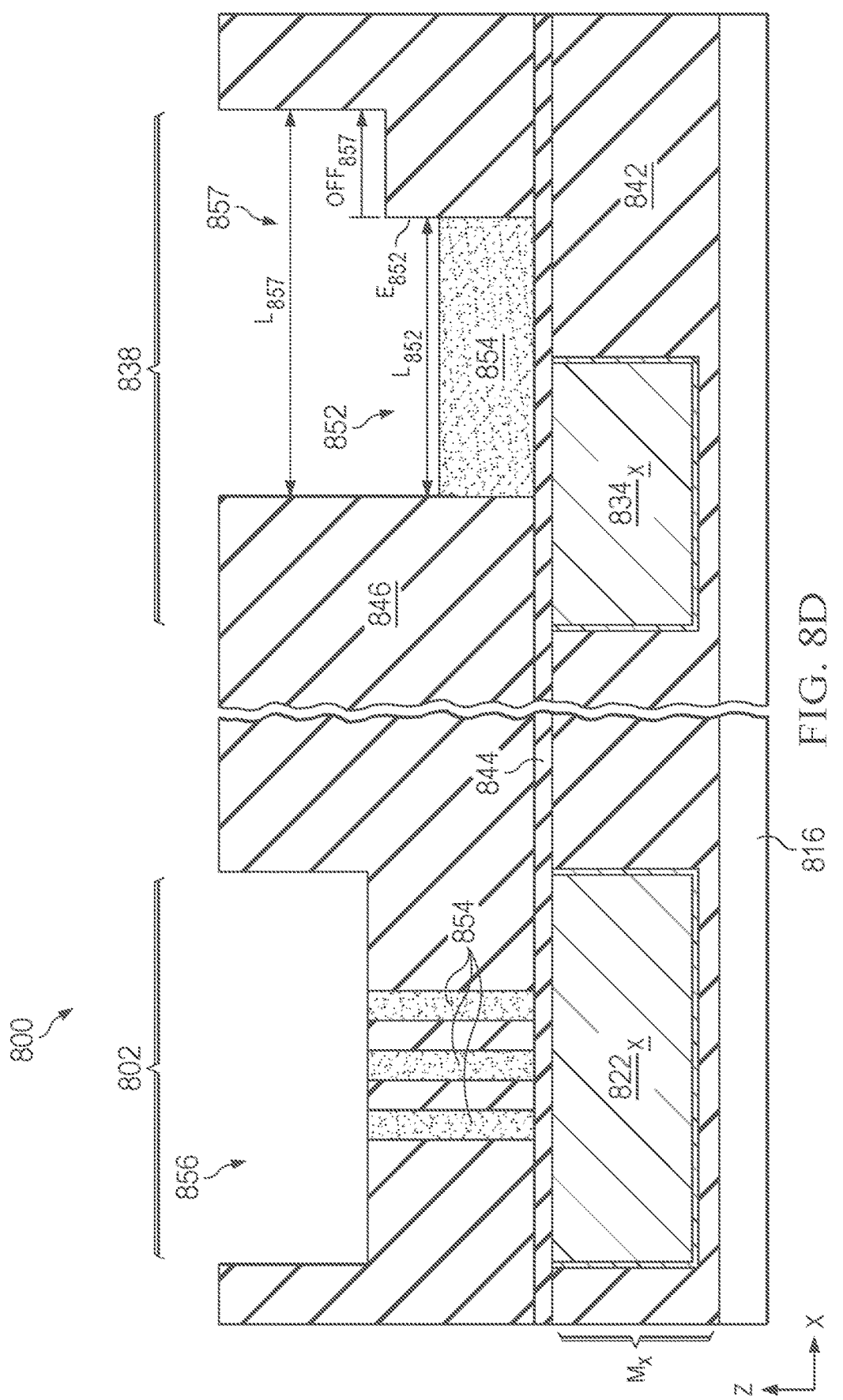

Next, as shown in FIG. 8D, an interconnect trench opening 856 and an inductor trench opening 857 are patterned and etched, wherein the sacrificial material 854 in the deep via openings 850 and deep tub opening 852 protects the metal layer interconnect element $822_x$ and metal layer inductor element $834_x$ from the trench etch.

The inductor trench opening 857 extends beyond the lateral perimeter of the deep tub opening 852 in at least one direction, e.g., in the x-direction and/or the y-direction. In the example shown in FIG. 8D, the trench opening 857 extends beyond one lateral edge $E_{852}$ of tub opening 852 in the x-direction by an offset distance $OFF_{857}$. In some examples, offset distance $OFF_{857}$ is in the range of 10-90%, e.g., in the range of 25%-75%, of the x-direction length $L_{852}$ of tub opening 852. In some examples, trench opening 857 may also extend beyond at least one lateral edge of tub opening 852 in the y-direction, e.g., by an offset distance in the range of 10-90%, e.g., in the range of 25%-75%, of the y-direction length of tub opening 852.

Figure 8E:
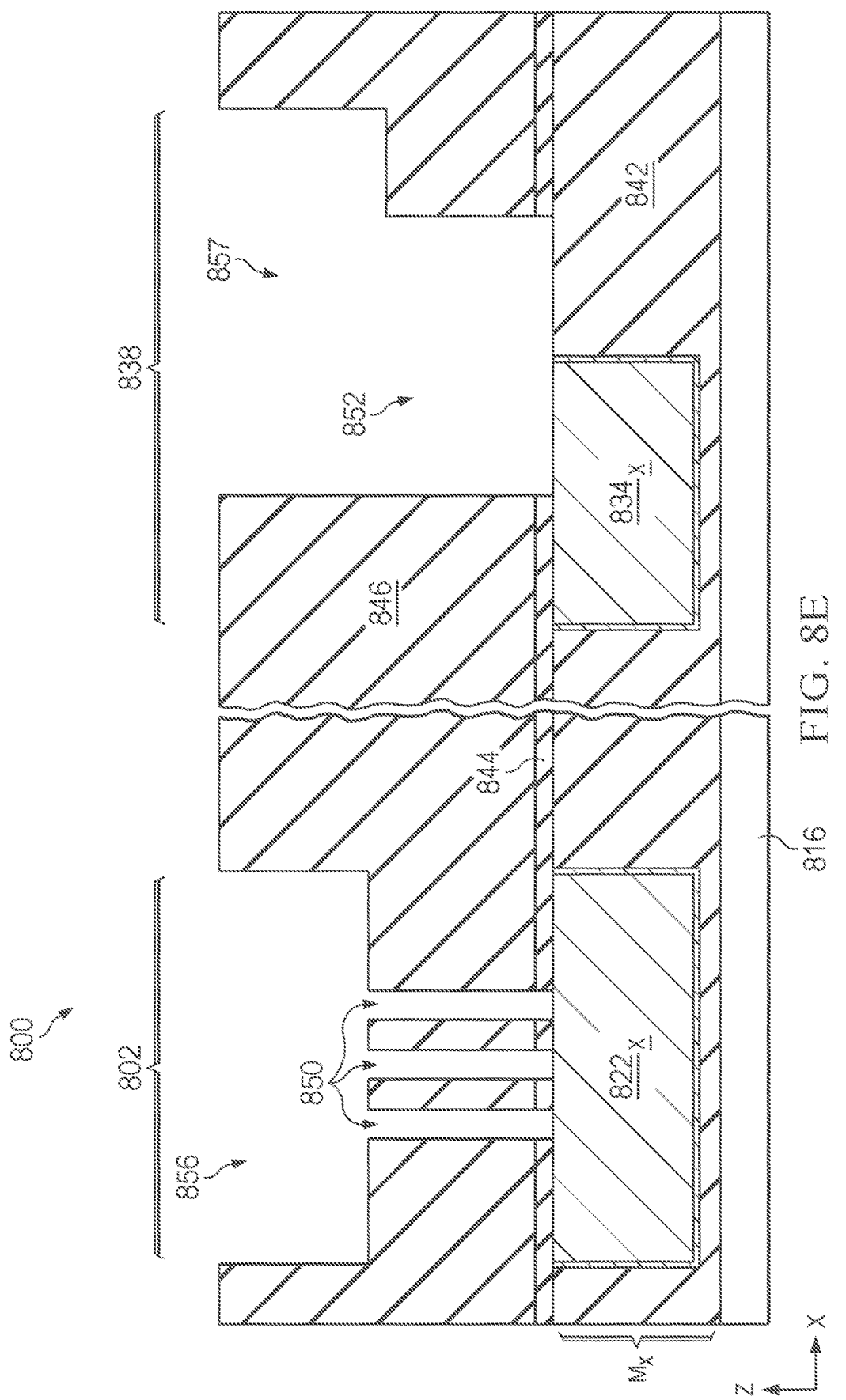
Figure 8F:
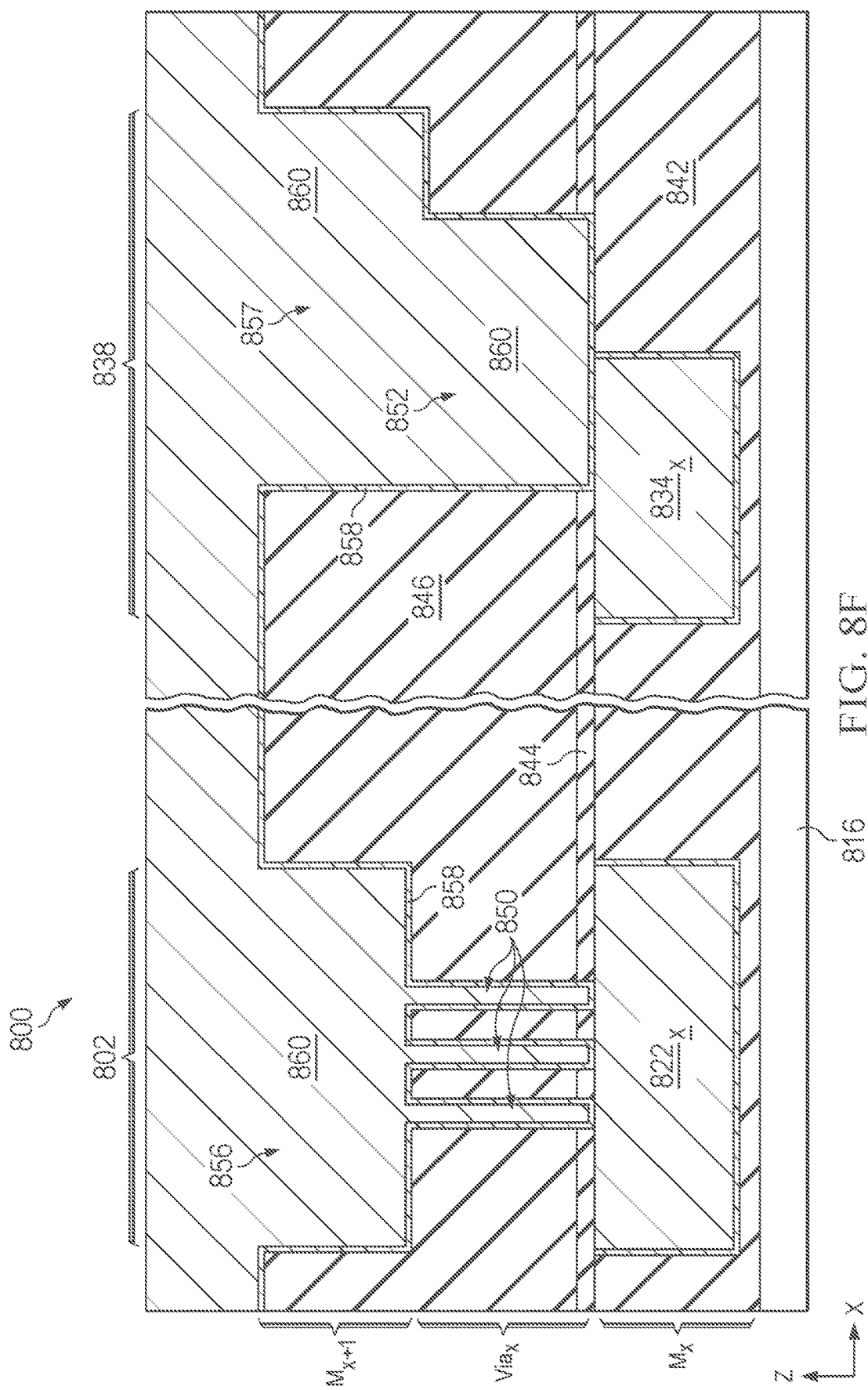

Next, as shown in FIG. 8E, the sacrificial material 854, along with remaining dielectric barrier layer 844 in deep via openings 850 and deep tub opening 852 are removed. In some examples sacrificial material 854 may be removed using an ash process, and dielectric barrier layer 844 may be removed using a nitride etch or other suitable etch.

Next, as shown in FIG. 8F, a barrier layer 858, e.g., comprising a TaN/Ta bilayer, is then deposited over the structure and into the interconnect trench opening 856, via openings 850, inductor trench opening 857, and deep tub opening 852. A metal 860 (e.g., copper) is then deposited over the barrier layer 858 to fill the interconnect trench opening 856, via openings 850, inductor trench opening 857, and deep tub opening 852. An anneal may be performed to anneal the deposited metal 860.

Figure 8G:
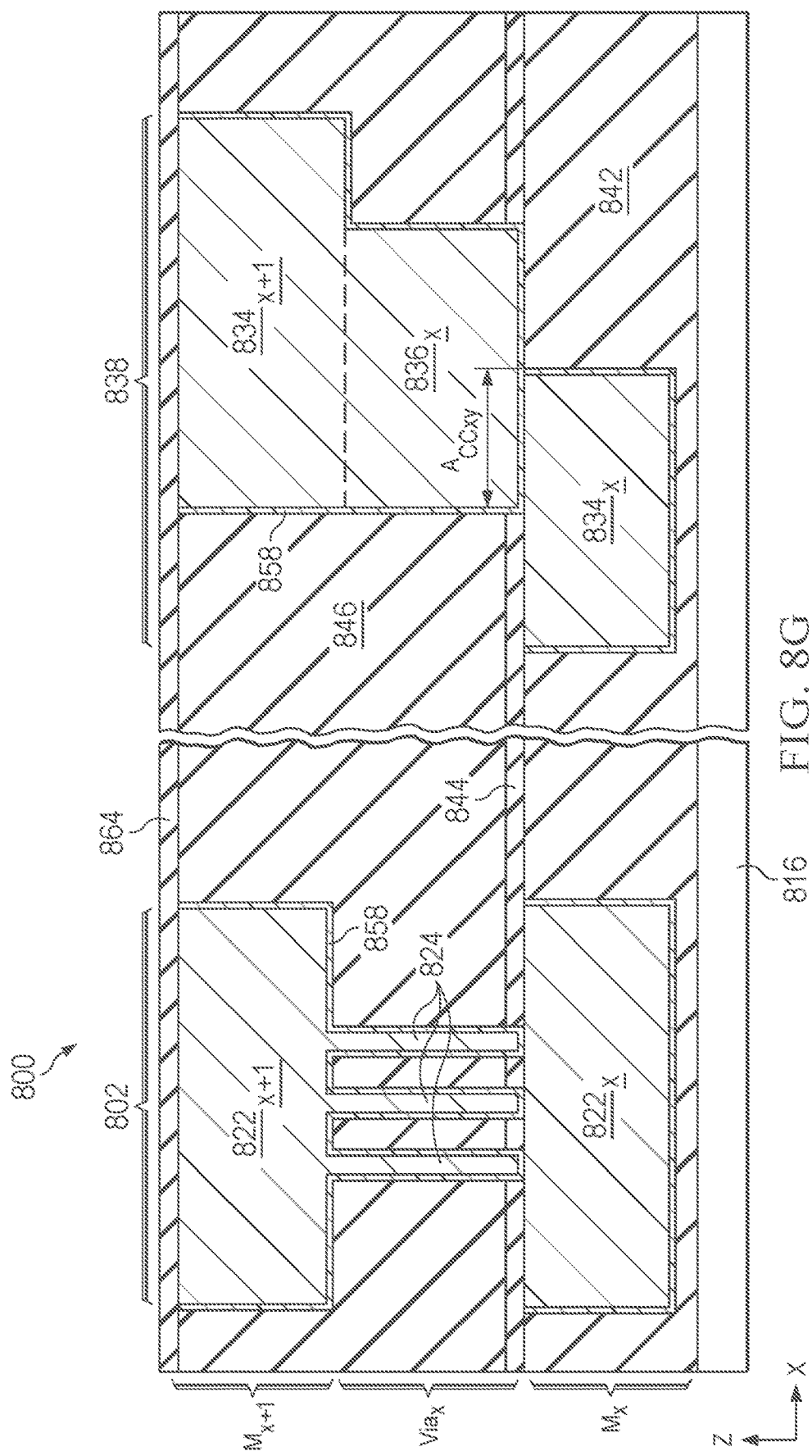

As shown in FIG. 8G, a CMP process may be performed to remove portions of the metal 860 (e.g., copper) outside (above) the interconnect trench opening 856 and inductor trench opening 857, and a dielectric barrier layer 864, e.g., comprising SiN or SiC, may be deposited over the structure. Remaining metal 860 in the interconnect via openings 850 defines interconnect vias 824 in a via layer $Via_x$; remaining metal 860 in the interconnect trench opening 856 defines a metal layer interconnect element $822_{x+1}$ in a metal interconnect layer $M_{x+1}$; remaining metal 860 in the deep tub opening 852 defines a via layer inductor element $836_x$ in the via layer $Via_x$; and remaining metal 860 in the inductor trench opening 857 defines a metal layer inductor element $834_{x+1}$ in the metal layer $M_{x+1}$.

The invention claimed is:

1. A device, comprising:
   an integrated circuit (IC) layer stack including multiple metal layers and multiple via layers formed in an alternating manner in a vertical direction, with respective via layers located between a respective pair of the metal layers;
   an integrated inductor comprising an inductor wire including multiple wire loops,
   wherein a respective wire loop of the multiple wire loops includes (a) a laterally-extending lower wire segment formed in a lower metal layer in the IC layer stack, (b) a laterally-extending upper wire segment formed in an upper metal layer in the IC layer stack, (c) a pair of vertically-extending side wire segments connected between the laterally-extending lower wire segment and the laterally-extending upper wire segment;
   wherein each vertically-extending side wire segment is defined by a multi-layer inductor element stack including:
      multiple metal layer inductor elements formed in multiple respective metal layers in the IC layer stack between the lower metal layer and the upper metal layer; and
      multiple via layer inductor elements formed in multiple respective via layers in the IC layer stack, wherein the multiple metal layer inductor elements and the multiple via layer inductor elements are conductively connected to each other;
      wherein the multiple via layer inductor elements each have a length of at least 1 µm in each of two lateral directions orthogonal to each other and perpendicular to the vertical direction; and
   a metal interconnect arrangement including:
      respective metal layer interconnect elements formed in the multiple respective metal layers; and
      respective interconnect vias formed in the multiple respective via layers.

2. The device of claim 1, wherein the respective interconnect vias have a length less than 1 µm in at least one of the two lateral directions.

3. The device of claim 1, wherein:
the multiple via layer inductor elements each have a length greater than 2 μm in each of the two lateral directions; and
the respective interconnect vias have a length less than 0.5 μm in at least one of two lateral directions perpendicular to the vertical direction.

4. The device of claim 1, wherein the multiple via layer inductor elements are formed in respective tub openings in the respective via layer, the respective tub openings having a length of at least 1 μm in each of the two lateral directions.

5. The device of claim 1, wherein the respective metal layer interconnect elements, the respective interconnect vias, the multiple metal layer inductor elements, and the multiple via layer inductor elements are formed from copper.

6. The device of claim 1, wherein a top metal layer of the multiple metal layers include comprises an aluminum bond pad layer.

7. The device of claim 1, wherein the inductor wire has a sheet resistance of less than 10 mΩ/sq.

8. The device of claim 1, wherein the inductor wire has a sheet resistance of less than 3 mΩ/sq.

9. The device of claim 1, wherein the multiple metal layer inductor elements are laterally aligned with the multiple via layer inductor elements.

10. The device of claim 1, wherein at least one of the multiple metal layer inductor elements is laterally offset from at least one of the multiple via layer inductor elements.

11. The device of claim 10, wherein:
the inductor element stack including the multiple metal layer inductor elements and the multiple via layer inductor elements defines a diagonally-extending wire segment of the inductor wire, the diagonally-extending wire segment extending diagonally with respect to the vertical direction.

12. The device of claim 1, wherein the integrated inductor comprises a spiral inductor, wherein the inductor wire has a spiral shape.

13. The device of claim 1, wherein:
the IC layer stack is formed over a silicon substrate; and
a magnetic B-field of the integrated inductor extends perpendicular to the silicon substrate.

14. The device of claim 1, wherein:
the IC layer stack is formed over a silicon substrate; and
a magnetic B-field of the integrated inductor extends parallel to the silicon substrate.

15. A device, comprising:
an integrated circuit (IC) layer stack formed over a silicon substrate, the IC layer stack including multiple metal layers and multiple via layers formed in an alternating manner in a vertical direction, with respective via layers located between a respective pair of the metal layers; and
an integrated inductor comprising a spiral inductor wire having a spiral shape including multiple wire loops and defining a magnetic B-field extending parallel to the silicon substrate;
wherein a respective wire loop of the multiple wire loops includes (a) a laterally-extending lower wire segment formed in a lower metal layer in the IC layer stack, (b) a laterally-extending upper wire segment formed in an upper metal layer in the IC layer stack, (c) a pair of vertically-extending side wire segments connected between the laterally-extending lower wire segment and the laterally-extending upper wire segment;
wherein each vertically-extending side wire segment is defined by a multi-layer inductor element stack including:
multiple metal layer inductor elements formed in multiple respective metal layers in the IC layer stack between the lower metal layer and the upper metal layer; and
multiple via layer inductor elements formed in multiple respective via layers in the IC layer stack, wherein the multiple metal layer inductor elements and the multiple via layer inductor elements are conductively connected to each other;
wherein the multiple via layer inductor elements each have a lateral dimension of at least 1 μm in each of two lateral directions orthogonal to each other and perpendicular to the vertical direction.

16. The device of claim 15, comprising a metal interconnect arrangement formed in the IC layer stack, the metal interconnect arrangement including:
a metal layer interconnect element formed in the respective metal layer; and
an interconnect via formed in the respective via layer and conductively coupled to the metal layer interconnect element.

17. The device of claim 15, wherein the metal layer inductor element is laterally offset from the via layer inductor element.

18. The device of claim 15, wherein the inductor element stack including the metal layer inductor element and the via layer inductor element extends diagonally with respect to the vertical direction.

19. A device, comprising:
an integrated circuit (IC) layer stack formed over a silicon substrate;
the IC layer stack including multiple metal layers and multiple via layers formed in an alternating manner in a vertical direction, with respective via layers located between a respective pair of the metal layers;
an integrated inductor including multiple wire loops, each wire loop comprising;
a laterally-extending lower wire segment formed in a lower metal layer in the IC layer stack;
a laterally-extending upper wire segment formed in an upper metal layer in the IC layer stack; and
a vertically-extending wire segment formed in the IC layer stack and conductively connecting the laterally-extending lower wire segment with the laterally-extending upper wire section;
wherein the vertically-extending wire segment comprises a multi-layer inductor element stack including:
multiple metal layer inductor elements formed in multiple respective metal layers in the IC layer stack between the lower metal layer and the upper metal layer; and
multiple via layer inductor elements formed in multiple respective via layers in the IC layer stack, wherein the multiple metal layer inductor elements and the multiple via layer inductor elements are conductively connected to each other;
wherein the via layer inductor element has multiple via layer inductor elements each have a length of at least 1 μm in each of two lateral directions orthogonal to each other and perpendicular to the vertical direction; and
wherein the inductor wire defines a magnetic B-field extending parallel to the silicon substrate.

20. The device of claim 19, wherein the vertically-extending wire segment extends diagonally with respect to the vertical direction.

\* \* \* \* \*